United States Patent
Chen et al.

(10) Patent No.: US 11,393,662 B2
(45) Date of Patent: Jul. 19, 2022

(54) APPARATUSES AND METHODS FOR PLASMA PROCESSING

(71) Applicant: Tokyo Electron Limited, Tokyo (JP)

(72) Inventors: Zhiying Chen, Austin, TX (US); Joel Blakeney, Austin, TX (US); Megan Carruth, Austin, TX (US); Peter Ventzek, Austin, TX (US); Alok Ranjan, Austin, TX (US); Kazuya Nagaseki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 369 days.

(21) Appl. No.: 16/411,619

(22) Filed: May 14, 2019

(65) Prior Publication Data

US 2020/0365369 A1    Nov. 19, 2020

(51) Int. Cl.
| | |
|---|---|
| *H01J 37/32* | (2006.01) |
| *C23C 16/455* | (2006.01) |
| *C23F 4/00* | (2006.01) |
| *H05H 5/00* | (2006.01) |
| *H01L 21/60* | (2006.01) |

(52) U.S. Cl.
CPC .... *H01J 37/3233* (2013.01); *C23C 16/45536* (2013.01); *C23F 4/00* (2013.01); *H01J 37/32* (2013.01); *H01J 37/3244* (2013.01); *H05H 5/00* (2013.01); *H01J 2237/06308* (2013.01); *H01J 2237/3321* (2013.01); *H01J 2237/3341* (2013.01); *H01L 2021/60165* (2013.01)

(58) Field of Classification Search
None
See application file for complete search history.

(56) References Cited

U.S. PATENT DOCUMENTS

| | | | |
|---|---|---|---|
| 9,520,275 | B2 | 12/2016 | Chen |
| 2011/0146909 | A1 | 6/2011 | Shih et al. |
| 2013/0001196 | A1 | 1/2013 | Hoffman et al. |
| 2014/0339980 | A1* | 11/2014 | Wu ............... H01J 37/3244 |
| | | | 315/5.13 |
| 2014/0360670 | A1 | 12/2014 | Chen et al. |
| (Continued) | | | |

FOREIGN PATENT DOCUMENTS

KR    20070033419 A    3/2007

OTHER PUBLICATIONS

PCT International Search Report and the Written Opinion of the International Searching Authority, PCT/US2020/029867, dated Aug. 14, 2020, 11 pages.

(Continued)

*Primary Examiner* — Stephanie P Duclair
(74) *Attorney, Agent, or Firm* — Slater Matsil, LLP

(57) ABSTRACT

A method of plasma processing comprises generating electrons in a source chamber, generating an electric potential gradient between the source chamber and a processing chamber by applying a first negative direct current (DC) voltage to the source chamber and a ground voltage to the processing chamber, accelerating the electrons from the source chamber through a dielectric injector and into the processing chamber using the electric potential gradient, and generating an electron-beam sustained plasma (ESP) in the processing chamber using the electrons from the source chamber.

21 Claims, 14 Drawing Sheets

(56) References Cited

U.S. PATENT DOCUMENTS

2015/0041432 A1* 2/2015 Chen .................. H01J 37/30
216/66
2017/0125217 A1* 5/2017 Dorf .................. H01J 37/3244

OTHER PUBLICATIONS

J Hopwood et al. "Langmuir probe measurements of a radio frequency induction plasma", Journal of Vacuum Science & Technology A11, 152, (1993); doi: 10.1116/1.578282, 6 pages.
S.G. Walton et al. "Electron Beam Generated Plasmas for Ultra Low Te Processing", ECS Journal of Solid State Science and Technology, 4 (6) N5033-N5040 (2015), 8 pages.
SD Baalrud et al. "Equilibrium states of anodic double layers", Plasma Sources Sci_ Technol_ 18 (2009) 035002 (11 pp.).

* cited by examiner

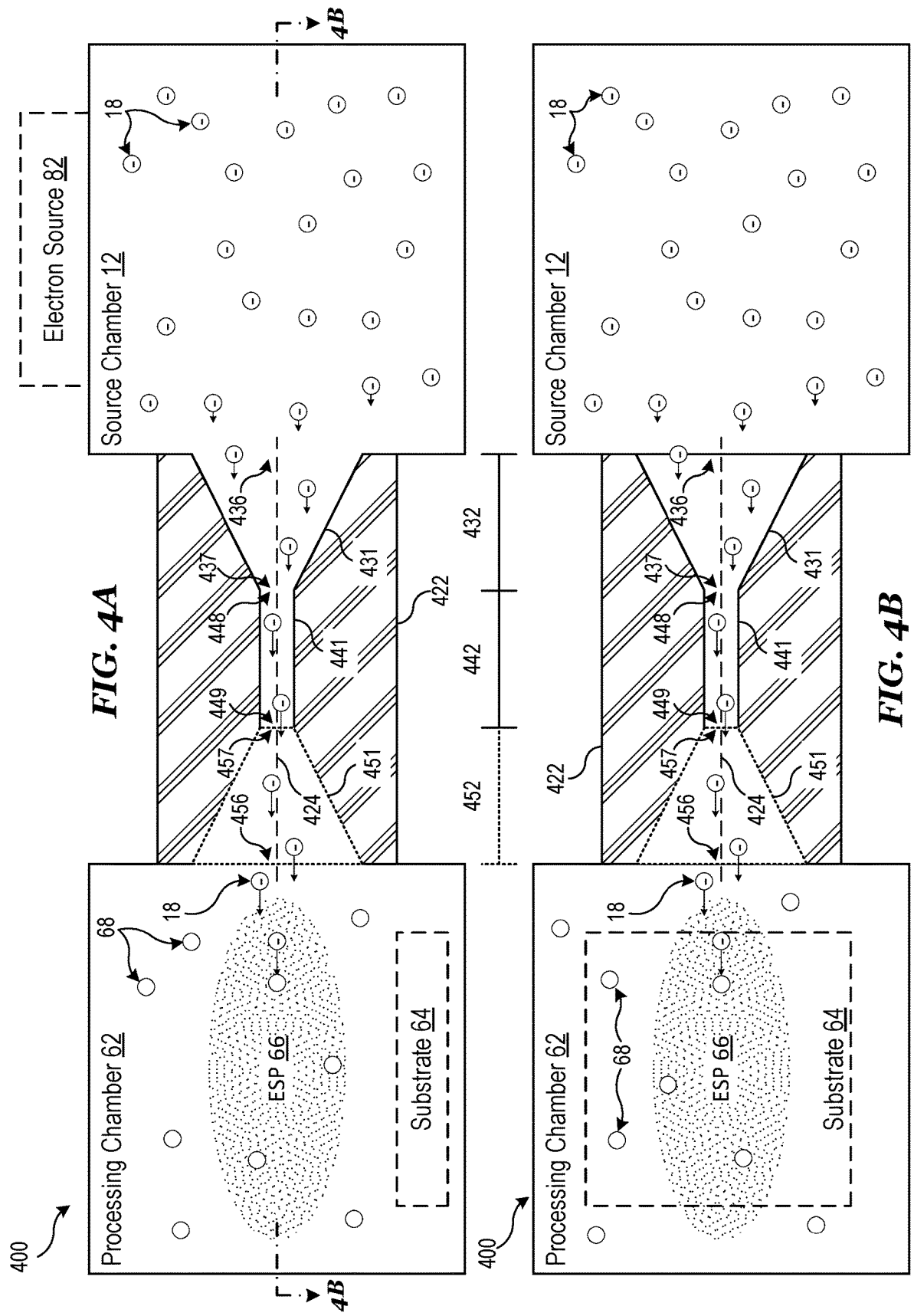

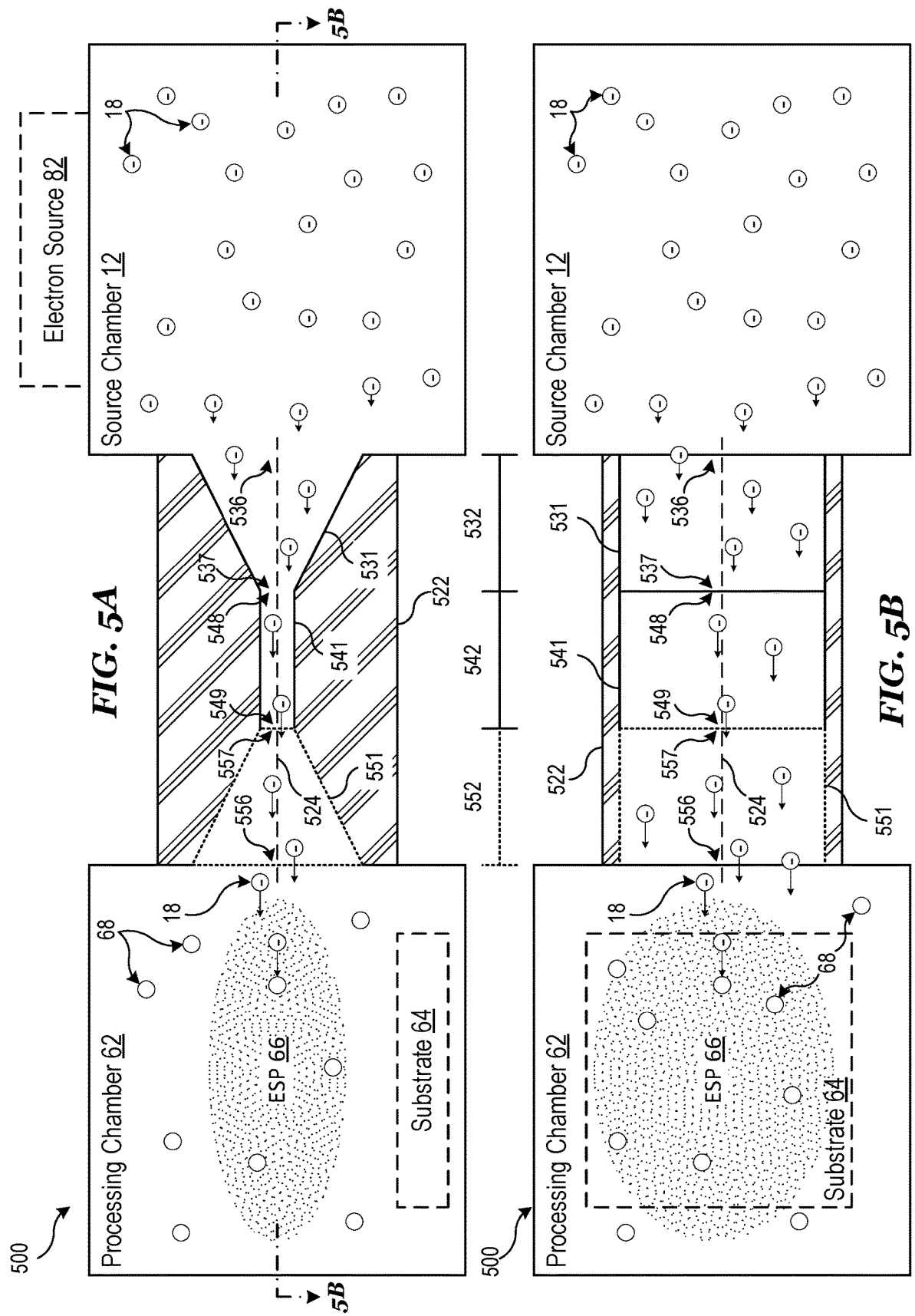

APPARATUSES AND METHODS FOR PLASMA PROCESSING

CROSS-REFERENCE TO RELATED APPLICATIONS

This application is related to U.S. patent application Ser. No. 16/411,633, which is incorporated herein by reference in its entirety.

TECHNICAL FIELD

The present invention relates generally to plasma processing apparatuses, and, in particular embodiments, to apparatuses and methods of plasma processing with uniform plasma having low electron temperature at low pressure.

BACKGROUND

Device formation within microelectronic workpieces may involve a series of manufacturing techniques including formation, patterning, and removal of a number of layers of material on a substrate. In order to achieve the physical and electrical specifications of current and next generation semiconductor devices, processing equipment and methods that enable reduction of feature size while maintaining structural integrity are desirable for various patterning processes. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters nanometer-scale semiconductor device fabrication nodes. Therefore, there is a desire for three-dimensional (3D) semiconductor devices in which transistors are stacked on top of each other.

As device structures densify and develop vertically, the desire for precision material processing becomes more compelling. Trade-offs between selectivity, profile control, film conformality, and uniformity in plasma processes can be difficult to manage. Thus, equipment and techniques that isolate, and control the process conditions that are optimal for etch and deposition regimes are desirable in order to precisely manipulate materials and meet advanced scaling challenges.

SUMMARY

In accordance with an embodiment of the invention, a method of plasma processing comprises generating electrons in a source chamber, generating an electric potential gradient between the source chamber and a processing chamber by applying a first negative direct current (DC) voltage to the source chamber and a ground voltage to the processing chamber, accelerating the electrons from the source chamber through a dielectric injector and into the processing chamber using the electric potential gradient, and generating an electron-beam sustained plasma (ESP) in the processing chamber using the electrons from the source chamber.

In accordance with another embodiment, a method of plasma processing comprises generating electrons in a source chamber, accelerating the electrons from the source chamber through a dielectric injector and into a processing chamber, generating an ESP in the processing chamber using the electrons from the source chamber, The method further includes maintaining a first electric potential within the source chamber while generating the ESP. A maximum electric potential of the first electric potential is negative with respect to a ground voltage. The method also includes maintaining a second electric potential within the processing chamber while generating the ESP. A minimum electric potential of the second electric potential is greater than the maximum electric potential of the first electric potential.

In accordance with still another embodiment of the invention, an apparatus comprises a DC voltage source comprising a positive terminal and a negative terminal. The positive terminal is electrically coupled to a ground voltage. The apparatus further comprises a source chamber electrically coupled to the negative terminal, a processing chamber electrically coupled to the positive terminal and the ground voltage, and a dielectric injector attached to the source chamber and the processing chamber. The dielectric injector is configured to deliver electrons from the source chamber to the processing chamber to generate an ESP in the processing chamber using the electrons from the source chamber.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A and 4B illustrate another schematic block diagram of an example plasma processing apparatus including a source chamber, a dielectric injector including a flared input region and a parallel region, and a processing chamber in accordance with an embodiment of the invention, where FIG. 4A illustrates a side view of the plasma processing apparatus and FIG. 4B illustrates a top view of the plasma processing apparatus;

FIGS. 5A and 5B illustrate still another schematic block diagram of an example plasma processing apparatus including a source chamber, a dielectric injector including a flared input region and a parallel region, and a processing chamber in accordance with an embodiment of the invention, where FIG. 5A illustrates a side view of the plasma processing apparatus and FIG. 5B illustrates a top view of the plasma processing apparatus;

FIG. 15A illustrates a side view of the dielectric injector and FIG. 15B illustrates an end view of the dielectric injector;

FIG. 16A illustrates a side view of the dielectric injector and FIG. 16B illustrates an end view of the dielectric injector;

FIG. 17A illustrates a side view of the dielectric injector and FIG. 17B illustrates an end view of the dielectric injector;

Figure 1:
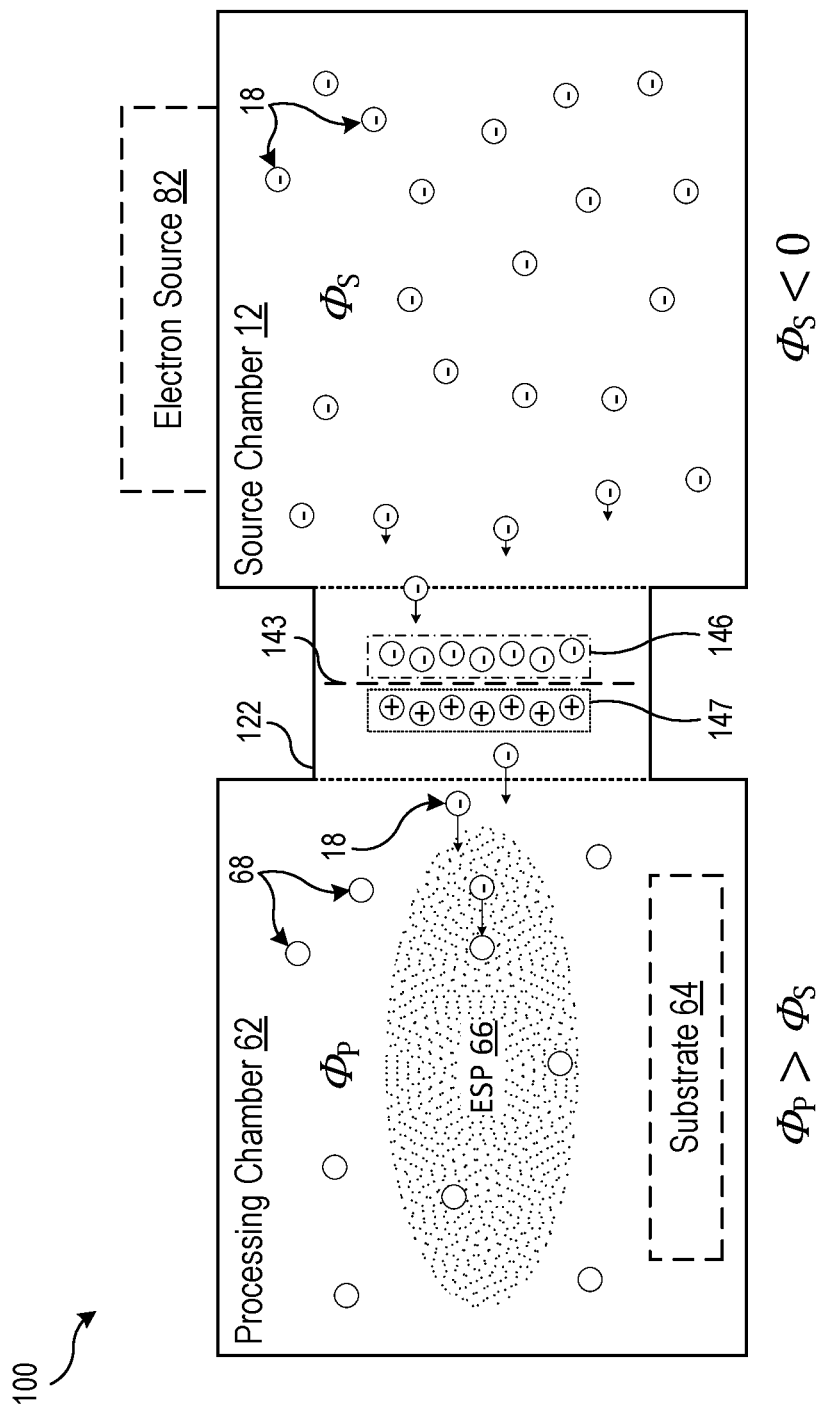
FIG. 1 illustrates a schematic block diagram of an example plasma processing apparatus including a source chamber and a processing chamber in accordance with an embodiment of the invention, where the source chamber includes electrons and a source chamber potential that is less than zero and the processing chamber includes an electron-beam sustained plasma and a processing chamber potential that is greater than the source chamber potential.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Various techniques, as described herein, pertain to device fabrication using precision plasma processing techniques, including etch and deposition processes. Several instances manifest in semiconductor manufacturing in both front end of line (FEOL, e.g., transistor fabrication) through to the back end of line (BEOL, e.g., interconnect fabrication), where materials are to be manipulated with a high degree of precision. Conventional plasma processing apparatuses and methods may be lacking in control of plasma properties including control of ion verticality, ion energy, electron temperature, plasma density, and electron energy distribution function (EEDF), and thus, have been deficient in meeting advanced scaling requirements.

Conventional plasma processing apparatuses produce high temperature electrons and operate at a relatively high pressure. Elevated electron temperature and high pressure each contribute to less vertical ions resulting in less vertical sidewalls, device damage, and undesirable by-products rendering conventional plasma processing apparatuses unsuitable for precision processing. Conventional plasma processing apparatuses may also produce non-uniform plasma densities which may result in uneven treatment of a substrate surface. Therefore, a plasma processing apparatus that generates plasma in a processing chamber that has uniform or substantially uniform density and low electron temperature at low pressure may be desirable. Additionally, it may be beneficial for a plasma processing apparatus to deliver absolutely vertical or substantially vertical ions to a substrate surface.

Various embodiments described provide apparatuses and methods that generate an electron-beam sustained plasma (ESP) with uniform or substantially uniform density and low electron temperature at low pressure in a processing chamber. The disclosed embodiments control the acceleration of electrons from a source chamber through a dielectric injector and into the processing chamber. Through these techniques, the disclosed embodiments may provide various advantages including control of plasma properties such as ion verticality, ion energy, electron temperature, plasma density, and EEDF. Additional implementations and advantages may also be apparent to one of skill in the art in view of the following description.

In particular, control of plasma properties such as ion verticality, ion energy, electron temperature, plasma density, and EEDF may be advantageous for high aspect ratio contact (HARC) type etches and patterning applications as well as other etch/deposition processes. Control of these plasma properties may also be beneficial for atomic level etch (ALE) and atomic level deposition (ALD) as well as spatial ALE/ALD and/or other processes.

Embodiments provided below describe various plasma processing apparatuses and methods of operating plasma processing apparatuses, and in particular, plasma processing apparatuses including a source chamber with a negative electrical potential and a dielectric injector. The following description describes the embodiments. Several embodiment plasma processing apparatuses including a source chamber and a processing chamber are described using FIGS. 1-3, 4A, 4B, 5A, and 5B. An embodiment dielectric injector is described using FIGS. 6A and 6B. Three embodiment flared regions are described using FIGS. 7-9. An embodiment symmetric dielectric injector is described using FIG. 10 while an embodiment asymmetric dielectric injector is described using FIG. 11. Several embodiment dielectric injectors including one or more slot openings are described using FIGS. 12-14. Various embodiment dielectric injectors including one or more parallel regions are described using FIGS. 15A-17B. An embodiment dielectric injector including a plurality of input flared regions and a plurality of parallel regions is described using FIG. 18. Three embodiment methods of operating embodiment plasma processing apparatuses are described using FIGS. 19-21.

FIG. 1 illustrates a schematic block diagram of an example plasma processing apparatus including a source chamber and a processing chamber, where the source chamber includes electrons and a source chamber potential that is less than zero and the processing chamber includes an electron-beam sustained plasma and a processing chamber potential that is greater than the source chamber potential in accordance with an embodiment of the invention.

Referring to FIG. 1, a plasma processing apparatus 100 includes a source chamber 12 and a processing chamber 62. The source chamber 12 includes source electrons 18 which are contained within the source chamber 12 and may be generated by an optional supplementary electron source 82 attached to the source chamber 12. The processing chamber 62 includes particles 68 which are contained within the processing chamber 62. An ESP 66 is also contained within the processing chamber 62 and generated using collisions of the source electrons 18 with the particles 68. The processing chamber 62 may also include an optional substrate 64 that is processed using the ESP 66.

The optional substrate 64 may be immobilized by a substrate holder which may also be an electrostatic chuck. In various embodiments, the optional substrate 64 is a wafer substrate. The optional substrate 64 may comprise a semiconductor material, for example. In some embodiments, the optional substrate 64 is a wafer substrate comprising silicon, and is a silicon wafer in one embodiment.

The source electrons 18 from the source chamber 12 are accelerated through a dielectric injector 122 and into the processing chamber 62. The dielectric injector 122 is disposed between the source chamber 12 and the processing chamber 62. For example, the dielectric injector 122 may be attached to both the source chamber 12 and the processing chamber 62. In various embodiments, the dielectric injector is directly attached to one or both of the source chamber 12 and the processing chamber 62. For example, the dielectric injector 122 may be mechanically coupled to the source chamber 12 and the processing chamber 62 such that the plasma processing apparatus 100 is airtight. The plasma processing apparatus wo is capable of holding a high vacuum (1 mTorr-1 µTorr) in one embodiment. In other embodiments, the plasma processing apparatus wo is capable of holding an ultra-high vacuum (1 µTorr-1 nTorr) or higher.

The dielectric injector 122 is disposed such that the source chamber 12 is electrically and spatially isolated from the processing chamber 62 by the dielectric injector 122. The dielectric injector 122 may advantageously be capable of withstanding high voltages from the ESP 66, collimating the source electrons 18, preventing electrical and/or material cross-talk between the source chamber 12 and the processing chamber 62, reducing contamination from materials (e.g. sputtered materials) leaving the source chamber 12, reducing electron temperature within the processing chamber 62, resisting high operating temperatures, and resisting degradation due to reactive or corrosive gases.

The dielectric injector 122 may be made of one or more dielectric materials. In one embodiment, the dielectric injector 122 is made of quartz. In other embodiments, the dielectric injector 122 is made of a ceramic material and is a high-temperature ceramic in some embodiments. The material composition of the dielectric injector 122 may influence the practical capabilities of one or more of these features such as the maximum ESP voltage, maximum operating temperature, and specific types of compatible reactive corrosive gases, among others.

During operation, the source chamber 12 is maintained at a source chamber electric potential $\Phi_S$. For example, the source chamber electric potential $\Phi_S$ may be an average electric potential within the source chamber 12 that is generated by one or more electrically conductive surfaces of the source chamber 12 being held at a particular voltage. The source chamber electric potential $\Phi_S$ is less than zero (e.g., an earth ground voltage or reference ground voltage) within the source chamber 12.

Also during operation, the processing chamber 62 is maintained at a processing chamber potential $\Phi_P$. Similar to the source chamber electric potential $\Phi_S$, the processing chamber potential $\Phi_P$ may be an average electric potential within the processing chamber 62 that is generated by one or more electrically conductive surfaces of the processing chamber 62 being held at a particular voltage. The processing chamber potential $\Phi_P$ is greater than the source chamber electric potential $\Phi_S$.

In some embodiments, the processing chamber potential $\Phi_P$ is generated by the plasma (i.e. ESP 66) generated in the processing chamber 62 that is generated by the source electrons 18 from the source chamber 12. The processing chamber potential $\Phi_P$ may also be influenced by a ground voltage applied to conductive surfaces of the processing chamber 62. In one embodiment, all electrically conductive interior surfaces of the processing chamber 62 are held at a ground voltage. In other embodiments one or more electrically conductive interior surfaces of the processing chamber 62 may be held at another voltage while sidewalls of the processing chamber 62 are held at the ground voltage.

The potential difference between the source chamber electric potential $\Phi_S$ and the processing chamber potential $\Phi_P$ accelerates the source electrons 18 from the source chamber 12 through the dielectric injector 122 and into the processing chamber 62. Due to the electrically nonconductive quality of the dielectric material in the dielectric injector 122, the charge transport to surfaces of the dielectric injector 122 is balanced. In other words, the total electron current from the source electrons 18 is balanced by a corresponding ion current from plasma ions of the ESP 66 to equal the current flowing through the one or more conductive surfaces of the source chamber 12 that are held at the source chamber electric potential $\Phi_S$.

This results in a plasma double layer 143 within the dielectric injector 122. For example, the plasma double layer 143 may result from electron and ion sheaths at surfaces of the dielectric injector 122. The plasma double layer 143 includes a portion of the source electrons 146 and a portion of the ESP ions 147. The plasma double layer 143 may decouple properties of species within the source chamber 12 from properties of species within the processing chamber 62. For example, the source electron temperature $T_{e,source}$ may be much higher than the ESP electron temperature $T_{e,ESP}$. Similarly, the source chamber pressure $P_S$ may be greater than the processing chamber pressure $P_P$. Alternatively, the source chamber pressure $P_S$ may be less than the processing chamber pressure $P_P$.

Due to the isolation of the ESP 66 in the processing chamber 62 from the source chamber 12, the ESP 66 may advantageously have different physics and chemistry than conventional processing plasmas. For example the plasma electrons of the ESP 66 may only interact with the cold background gas. The ESP electron temperature $T_{e,ESP}$ and consequently the ESP ion temperature $T_{i,ESP}$ may be lower than conventional processing plasmas. In one embodiment, the ESP electron temperature $T_{e,ESP}$ may be between about 300 meV and about 500 meV. In one embodiment the ESP electron temperature $T_{e,ESP}$ is about 400 meV. In another embodiment the ESP electron temperature $T_{e,ESP}$ is about 300 meV.

Additionally, the ESP 66 may beneficially be generated and maintained at much lower pressure than conventional processing plasma. The processing chamber pressure $P_P$ is between about 1 mTorr and about 10 mTorr in one embodiment. In another embodiment, the processing chamber pressure $P_P$ is between about 100 μTorr and about 3 mTorr. The processing chamber pressure $P_P$ may be based on specific requirements of a given process and may also be higher or lower than the ranges explicitly given above. Notably, the plasma processing apparatus 100 is advantageously capable of igniting and sustaining a plasma at lower pressures than conventional plasma processing apparatuses.

The particles 68 contained in the processing chamber 62 may be neutral particles in a gaseous state. In one embodiment, the particles 68 are an argon (Ar) gas. In another embodiment, the particles 68 are an oxygen ($O_2$) gas. In still another embodiment, the particles 68 are a nitrogen ($N_2$) gas. In yet still another embodiment, the particles 68 are a tetrafluoromethane ($CF_4$) gas. While several illustrative embodiments of particles have been described, this description is not intended to be construed in a limiting sense. Other suitable particles will be apparent to persons skilled in the art upon reference to the description.

The optional supplementary electron source 82 may be implemented as any suitable source of electrons. For example, the optional supplementary electron source 82 may be an external electron source as shown. In other embodiments the optional supplementary electron source 82 may be omitted and the source electrons 18 may be generated within the source chamber 12 using an internal electron source or by other suitable means. In one embodiment, the optional supplementary electron source 82 is an inductively coupled plasma (ICP) source. In another embodiment, the optional supplementary electron source 82 is a transformer coupled plasma (TCP) source. In other embodiments, the optional supplementary electron source 82 may be a capacitively coupled plasma (CCP) source, electron cyclotron resonance (ECR) source, surface wave plasma (SWP) source, hollow cathode source, filament, and the like.

Figure 2:
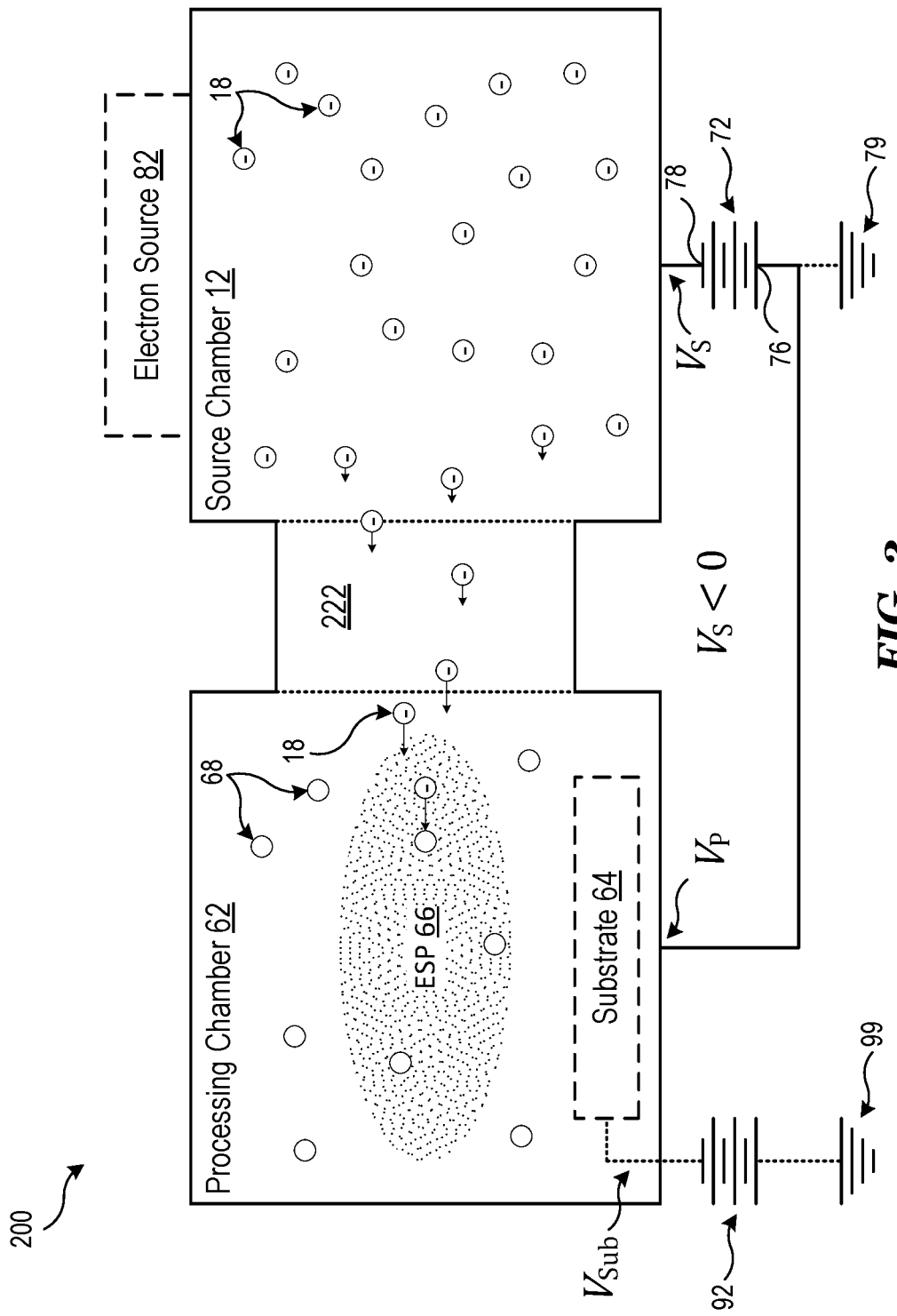
FIG. 2 illustrates a schematic block diagram of an example plasma processing apparatus including a source chamber electrically coupled to a negative terminal of a direct current voltage source and a processing chamber electrically coupled to both the positive terminal of the direct voltage source and to a ground voltage in accordance with an embodiment of the invention, where the source chamber includes electrons and the processing chamber includes an electron-beam sustained plasma.

FIG. 2 illustrates a schematic block diagram of an example plasma processing apparatus including a source chamber electrically coupled to a negative terminal of a direct current voltage source and a processing chamber electrically coupled to both the positive terminal of the direct voltage source and to a ground voltage, where the source chamber includes electrons and the processing chamber includes an electron-beam sustained plasma in accordance with an embodiment of the invention. Similarly labeled elements may be as previously described.

Referring to FIG. 2, a plasma processing apparatus 200 includes a source chamber 12 containing source electrons 18 and a processing chamber 62 containing an ESP 66 generated using collisions of the source electrons 18 with particles 68 in the processing chamber 62. The source electrons 18 may be generated using an optional supplementary electron source 82. An optional substrate 64 to be processed by the ESP 66 may be included in the processing chamber 62. A dielectric injector 222 is disposed between the source chamber 12 and the processing chamber 62. The dielectric injector 22 may be a similar to other embodiment dielectric injectors such as the dielectric injector 122 of FIG. 1, for example.

The plasma processing apparatus 200 further includes direct current (DC) voltage source 72 comprising a positive terminal 76 and a negative terminal 78. The negative terminal 78 is electrically coupled to the source chamber 12 and supplies a source chamber voltage $V_s$ to the source chamber 12. The positive terminal 76 of the DC voltage source 72 is electrically coupled to the processing chamber 62 and supplies a processing chamber voltage $V_P$ to the processing chamber 62. The positive terminal 76 and the processing chamber 62 are optionally electrically coupled to an optional ground connection 79 held at a ground voltage (e.g. 0 V). The ground voltage may be an earth ground voltage or reference ground voltage.

The source chamber voltage $V_s$ is a negative voltage with respect to the ground voltage. The source chamber voltage $V_s$ may be used to control the electric potential within the source chamber 12. For example, one or more electrically conductive surfaces of the source chamber 12 may be allowed to float. The source chamber voltage $V_s$ may be used to apply a negative DC voltage to the source chamber 12.

The processing chamber voltage $V_P$ is greater than the source chamber voltage $V_s$. In various embodiments, the processing chamber voltage $V_P$ is the ground voltage and is an earth ground voltage in one embodiment. In another embodiment, the processing chamber voltage $V_P$ is a reference ground voltage. The processing chamber voltage $V_P$ is applied to the processing chamber 62 to generate an electric potential gradient between the processing chamber 62 and the source chamber 12. The source electrons 18 are accelerated into the processing chamber 62 by the electric potential gradient.

An optional DC voltage source 92 may be electrically coupled to the optional substrate 64. The optional DC voltage source 92 may apply a substrate voltage $V_{Sub}$ which is negative with respect to a ground voltage. In one embodiment, the substrate voltage $V_{Sub}$ is a negative DC voltage with respect to the ground voltage of the optional ground connection 79. The optional DC voltage source 92 may also be electrically coupled to a second optional ground connection 99 which is held at a ground voltage. The ground voltage of the second optional ground connection 99 may be the same or different from the ground voltage of the optional ground connection 79.

The substrate voltage $V_{Sub}$ may advantageously attract ions of the ESP 66 towards the optional substrate 64. In various embodiments in which the optional DC voltage source 92 is included, the processing chamber voltage $V_P$ is only applied to the sidewalls of the processing chamber 62. Alternatively, the substrate voltage $V_{Sub}$ may be applied to the optional substrate 64 while the processing chamber voltage $V_P$ is applied to any suitable combination of electrically conductive surfaces of the processing chamber 62.

The plasma processing apparatus 200 may advantageously produce an ESP plasma with lower ESP electron temperature $T_{e,ESP}$ and ESP ion temperature $T_{i,ESP}$ than conventional plasma processing apparatuses. For example, conventional plasma processing apparatuses may apply an external electric field to maintain the plasma. This disadvantageously introduces an external electric field in the conventional processing chamber and raises the electron and ion temperatures in the conventional processing chamber. In contrast, a negative voltage (source chamber voltage $V_s$) is applied to the source chamber 12 of the plasma processing apparatus 200 allowing the processing chamber voltage $V_P$ to be a ground voltage or a negative voltage greater than the source chamber voltage $V_s$ while still accelerating the source electrons 18 into the processing chamber 62. This advantageously enables the ESP electron temperature $T_{e,ESP}$ and ESP ion temperature $T_{i,ESP}$ to be lower than conventional processing plasmas. For example, in implementations where the processing chamber voltage $V_P$ is equal to the ground voltage, no external electric field is generated by the processing chamber voltage $V_P$.

Figure 3:
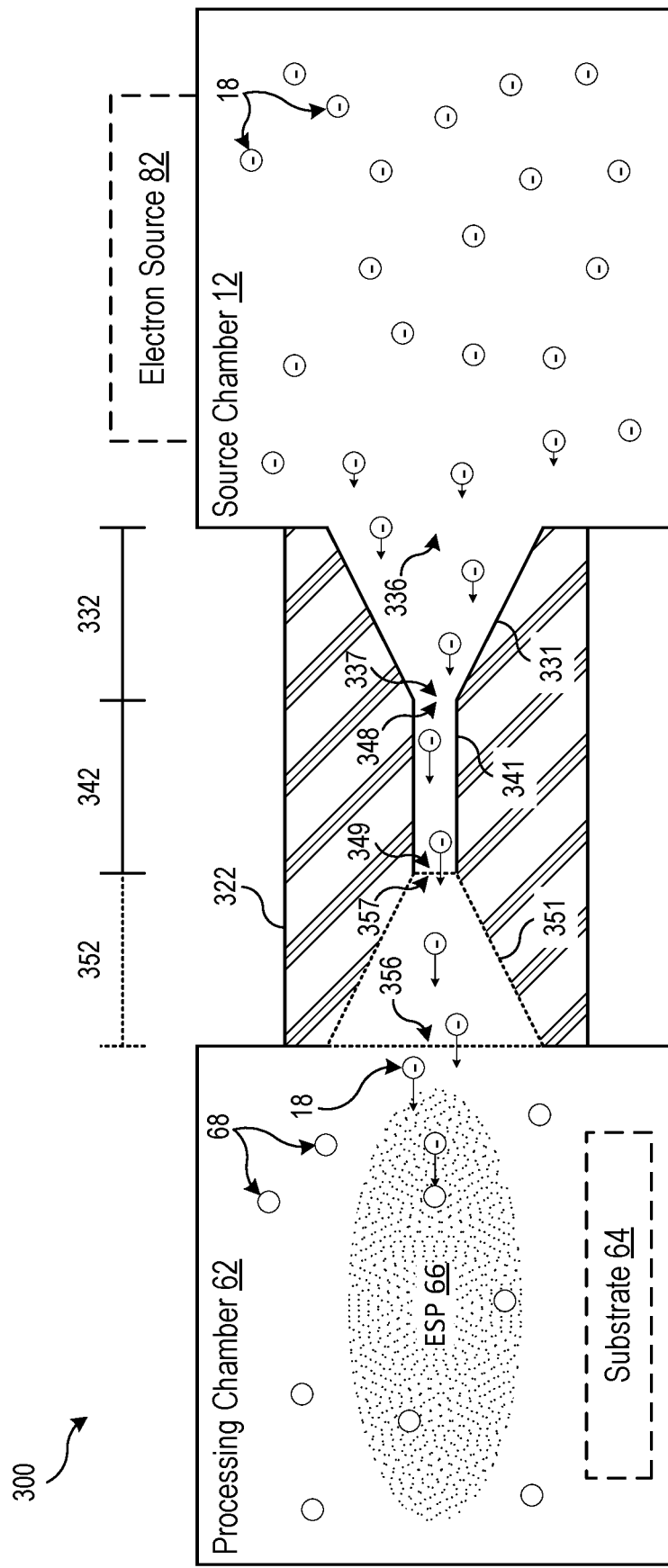
FIG. 3 illustrates a schematic block diagram of an example plasma processing apparatus including a source chamber, a dielectric injector including a flared input region and a parallel region, and a processing chamber in accordance with an embodiment of the invention.

FIG. 3 illustrates a schematic block diagram of an example plasma processing apparatus including a source chamber, a dielectric injector including a flared input region and a parallel region, and a processing chamber in accordance with an embodiment of the invention. Similarly labeled elements may be as previously described.

Referring to FIG. 3, a plasma processing apparatus 300 includes a source chamber 12 containing source electrons 18 and a processing chamber 62 containing an ESP 66 generated using collisions of the source electrons 18 with particles 68 in the processing chamber 62. The source electrons 18 may be generated using an optional supplementary electron source 82. An optional substrate 64 to be processed by the ESP 66 may be included in the processing chamber 62. The plasma processing apparatus 300 may be a specific implementation of other plasma processing apparatuses such as the plasma processing apparatus 100 of FIG. 1, for example.

A dielectric injector 322 is disposed between the source chamber 12 and the processing chamber 62. The dielectric injector 322 may be a specific implementation of other embodiment dielectric injectors such as the dielectric injector 122 of FIG. 1, for example. The dielectric injector 322 includes a flared input region 332, a parallel region 342, and an optional flared output region 352. The flared input region 332 includes a wide entry opening 336 opening into the source chamber 12 and a narrow exit opening 337. Similarly, the optional flared output region 352 includes a narrow entry opening 357 and a wide exit opening 356 that may open into the processing chamber 62.

The parallel region 342 includes an input opening 348 adjacent to the narrow exit opening 337 and an output opening 349. The input opening 348 and the output opening 349 are substantially identical in size. In one embodiment, the input opening 348 and the output opening 349 are identical and parallel sidewalls 341 of the parallel region 342 connecting the input opening 348 and the output opening 349 are parallel. The parallel region 342 is disposed between the flared input region 332 and the optional flared output region 352. If the optional flared output region 352 is included, the output opening 349 of the parallel region 342 is adjacent to the narrow entry opening 357. Alternatively, if the optional flared output region 352 is omitted, the output opening 349 may be directly attached to the processing chamber 62.

The source electrons 18 are accelerated from the source chamber 12 into wide entry opening 336 of the flared input region 332. The size (i.e. the area bounded by the opening) of the wide entry opening 336 is greater than the size of the narrow exit opening 337. Therefore, the source electrons 18 may be concentrated as they pass through the flared input region 332 and through the narrow exit opening 337 into the parallel region 342. For example, the source electrons 18 entering the processing chamber 62 may have a higher current density than the source electrons 18 in the source chamber 12.

Additionally or alternatively, the source electrons 18 within the flared input region 332 may be gradually funneled into the parallel region 342 to advantageously enable extraction of high energy source electrons. Another possible advantage of the gradual slope of the flared input sidewalls 331 of the flared input region 332 is to avoid sharp edges in the dielectric injector 322 which reduces or minimizes local electric fields and collisions with surfaces of the dielectric injector 322. This may further reduce sputtering and contamination in the processing chamber 62.

Additionally, since the sizes of the input opening 348 and the output opening 349 are substantially identical, the source electrons 18 may be collimated as they pass through the parallel region 342. For example, the source electrons 18 entering the processing chamber 62 may have a substantially uniform velocity that is parallel to the parallel sidewalls 341 of the parallel region 342.

The size of the narrow entry opening 357 is less than the size of the wide exit opening 356. Therefore, if the optional flared output region 352 is included, the density of the source electrons 18 may decrease between the narrow entry opening 357 and the processing chamber 62. This may be beneficially allow the collimated beam of source electrons 18 exiting the parallel region 342 to expand to increase the effective cross-section of the ESP 66 in the processing chamber 62. Additionally or alternatively, the gradual slope of the flared output sidewalls 351 of the optional flared output region 352 may improve the extraction of high energy electrons by further reducing or minimizing local electric fields and collisions with surfaces of the dielectric injector 322 in a similar manner as the flared input region 332.

In some implementations, corners formed from connections between regions such as between the flared input region 332 and the parallel region 342 as well as between the parallel region 342 and the optional flared output region 352 may be rounded to further reduce or minimize local electric fields and collisions with surfaces of the dielectric injector 322. Additionally or alternatively, corners between the source chamber 12 and the dielectric injector 322 and between the processing chamber 62 and the dielectric injector 322 may also be rounded.

FIGS. 4A and 4B illustrate another schematic block diagram of an example plasma processing apparatus including a source chamber, a dielectric injector including a flared input region and a parallel region, and a processing chamber, where FIG. 4A illustrates a side view of the plasma processing apparatus and FIG. 4B illustrates a top view of the plasma processing apparatus in accordance with an embodiment of the invention. Similarly labeled elements may be as previously described.

Referring to FIGS. 4A and 4B, a plasma processing apparatus 400 includes a source chamber 12 containing source electrons 18 and a processing chamber 62 containing an ESP 66 generated using collisions of the source electrons 18 with particles 68 in the processing chamber 62. The source electrons 18 may be generated using an optional supplementary electron source 82, such as a filament. An optional substrate 64 to be processed by the ESP 66 may be included in the processing chamber 62. The plasma processing apparatus 400 may be a specific implementation of other plasma processing apparatuses such as the plasma processing apparatus 300 of FIG. 3, for example.

A dielectric injector 422 is disposed between the source chamber 12 and the processing chamber 62. The dielectric injector 422 may be a specific implementation of other embodiment dielectric injectors such as the dielectric injector 322 of FIG. 3, for example. The dielectric injector 422 includes a flared input region 432, a parallel region 442, and an optional flared output region 452. The flared input region 432 includes a wide entry opening 436 opening into the source chamber 12, flared input sidewalls 431, and a narrow exit opening 437. Similarly, the optional flared output region 452 includes a narrow entry opening 457, flared output sidewalls 451, and a wide exit opening 456 that may open into the processing chamber 62. The parallel region 442 includes an input opening 448, parallel sidewalls 441, and an output opening 449.

As shown in FIGS. 4A and 4B, the dielectric injector 422 may be radially symmetric about a longitudinal axis 424 of the dielectric injector 422. For example, all cross sections of the flared input region 432, the parallel region 442, and the optional flared output region 452 perpendicular to the longitudinal axis 424 may have a circular shape. In one embodiment, the flared input region 432 is conic. In another embodiment, the flared input region 432 is a parabolic cone. The optional flared output region 452 may have a similar or different shape than the flared input region 432. In one embodiment, the parallel region 442 is cylindrical. Other suitable radially symmetric shapes for the flared input region 432, the parallel region 442, and the optional flared output region 452 will be apparent to persons skilled in the art upon reference to the description.

Radially symmetric shapes of the flared input region 432, the parallel region 442, and the optional flared output region 452 may advantageously produce a beam of source electrons 18 entering the processing chamber 62. The width of the beam of source electrons 18 may be controlled by the shape and dimensions of the dielectric injector 422. A more localized beam of source electrons 18 may beneficially enable localized processing of a substrate and/or increased uniformity within a processed region of the substrate.

FIGS. 5A and 5B illustrate still another schematic block diagram of an example plasma processing apparatus including a source chamber, a dielectric injector including a flared input region and a parallel region, and a processing chamber, where FIG. 5A illustrates a side view of the plasma processing apparatus and FIG. 5B illustrates a top view of the plasma processing apparatus in accordance with an embodiment of the invention. Similarly labeled elements may be as previously described.

Referring to FIGS. 5A and 5B, a plasma processing apparatus 500 includes a source chamber 12 containing source electrons 18 and a processing chamber 62 containing an ESP 66 generated using collisions of the source electrons 18 with particles 68 in the processing chamber 62. The source electrons 18 may be generated using an optional supplementary electron source 82. An optional substrate 64 to be processed by the ESP 66 may be included in the processing chamber 62. The plasma processing apparatus 500 may be a specific implementation of other plasma processing apparatuses such as the plasma processing apparatus 300 of FIG. 3, for example.

A dielectric injector 522 is disposed between the source chamber 12 and the processing chamber 62. The dielectric injector 522 may be a specific implementation of other embodiment dielectric injectors such as the dielectric injector 322 of FIG. 3, for example. The dielectric injector 522 includes a flared input region 532, a parallel region 542, and an optional flared output region 552. The flared input region 532 includes a wide entry opening 536 opening into the source chamber 12, flared input sidewalls 531, and a narrow exit opening 537. Similarly, the optional flared output region 552 includes a narrow entry opening 557, flared output sidewalls 551, and a wide exit opening 556 that may open into the processing chamber 62. The parallel region 542 includes an input opening 548, parallel sidewalls 541, and an output opening 549.

As shown in FIGS. 5A and 5B, the flared input region 532 and the optional flared output region 552 are flared when viewed from the side, but not flared when viewed from above. In other words, the flared input region 532 and the optional flared output region 552 are substantially triangularly prismatic while the parallel region 542 is rectangularly prismatic.

The respective prismatic shapes of the flared input region 532, the parallel region 542, and the optional flared output region 552 may advantageously produce a sheet of source electrons 18 entering the processing chamber 62. The height of the sheet of source electrons 18 may be controlled by the shape and dimensions of the dielectric injector 522. A thinner sheet of source electrons 18 may beneficially increase uniformity of a processed region of a substrate. Due to the rectangular shape of the output opening 549, the dielectric injector 522 may be referred to as a slot injector.

Although the flared input region 532 and optional flared output region 552 are illustrated as having parallel sidewalls in a top view, the flared input sidewalls 331 and flared output sidewalls 351 may be flared in the top view as well as the side view. Similarly, sharp corners between regions and/or chambers may be rounded as described in other embodiments.

Figure 6A:
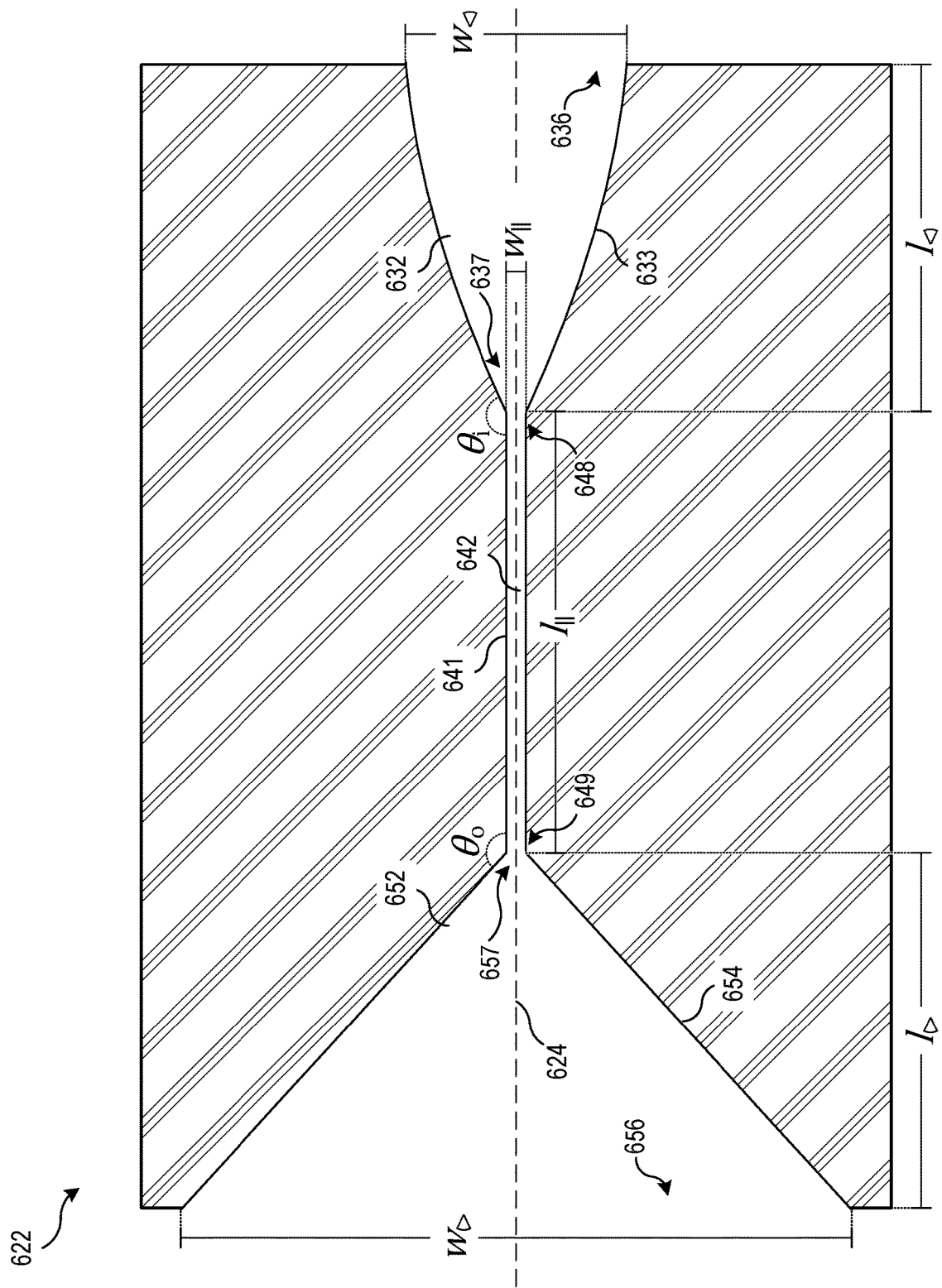
FIGS. 6A and 6B illustrate a schematic diagram of an example dielectric injector including a flared input region, a parallel region, and a flared output region in accordance with an embodiment of the invention.
Figure 6B:
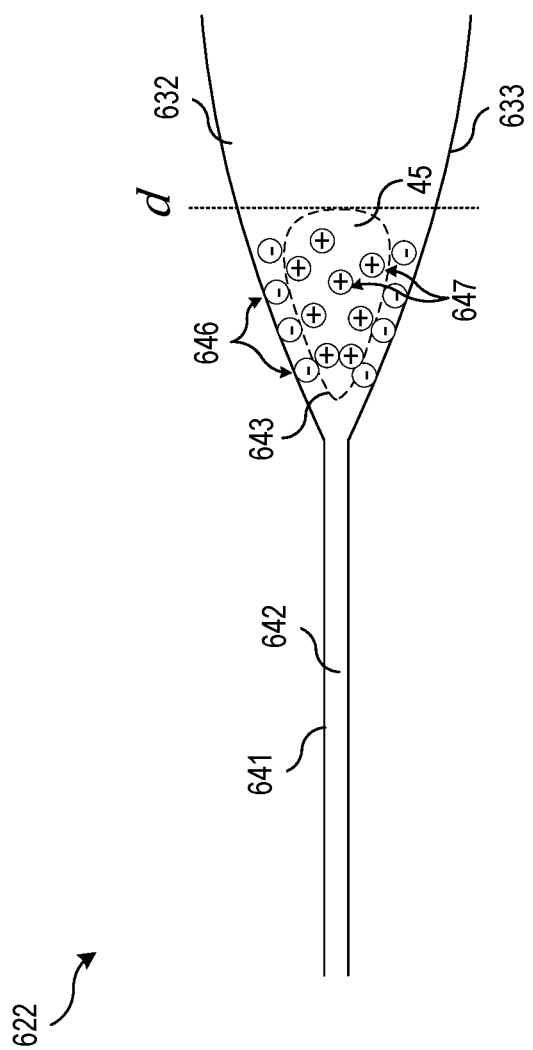

FIGS. 6A and 6B illustrate a schematic diagram of an example dielectric injector including a flared input region, a parallel region, and a flared output region in accordance with an embodiment of the invention.

Referring to FIG. 6A, a dielectric injector 622 includes a flared input region 632, a parallel region 642, and a flared output region 652. The dielectric injector 622 may be a specific implementation of other embodiment dielectric injectors such as the dielectric injector 322 of FIG. 3, for example. The flared input region 632 includes curved flared input sidewalls 633. The parallel region 642 includes parallel sidewalls 641. The flared output region 652 includes straight flared output sidewalls 654.

In contrast to the straight flared output sidewalls 654 which do not include any curvature when viewed from cross sections taken through the longitudinal axis 624, the curved flared input sidewalls 633 include a gradual curvature when viewed from cross sections taken through the longitudinal axis 624. Additionally, the gradual curvature may be a smooth gradual curvature such that it does not include sharp corners. In other embodiments, the flared input region 632 has straight sidewalls. Similarly, the flared output region 652 has curved sidewalls in some embodiments.

Several parameters of the dielectric injector 622 are illustrated in FIG. 6A. For example, each region of the dielectric injector includes a length and a width. The flared input region 632 includes a flared input width $w_\triangleright$ and a flared input length $l_\triangleright$. As shown, the flared input width $w_\triangleright$ corresponds to the vertical size of the wide entry opening 636. In the case of radial symmetry of the dielectric injector 622, the flared input width $w_\triangleright$ corresponds to the size of the wide entry opening 636 as measured from any side. In other implementations, such as in slot injector configurations, the flared input width $w_\triangleright$ may only correspond to the vertical size of the wide entry opening 636.

The parallel region 642 includes a parallel width $w_\|$ and a parallel length $l_\|$. The parallel width $w_\|$ corresponds with the sizes of both the input opening 648 and the output opening 649 due to the parallel sidewalls 641 being both straight and parallel. In various embodiments, the ratio of the parallel length $l_\|$ to the parallel width $w_\|$ is large. For example, in some embodiments, the ratio of the parallel length $l_\|$ to the parallel width $w_\|$ is greater than 5:1. In some embodiments, the ratio of the parallel length $l_\|$ to the parallel width $w_\|$ is between 10:1 and 20:1. In a specific embodiment, the ratio of the parallel length $l_\|$ to the parallel width $w_\|$ is about 13.3:1. For example, the parallel length $l_\|$ may be about 20 mm while the parallel width $w_\|$ is about 1.5 mm resulting in a ratio of 40:3 which is approximately 13.3:1.

The flared output region 652 includes a flared output width $w_\triangleright$ and a flared output length $l_\triangleright$. The flared output width $w_\triangleright$ corresponds to the vertical size of the wide exit opening 656. Similar to the flared input width $w_\triangleright$, the flared output width $w_\triangleright$ may correspond to the size of the wide exit opening 656 as measured from any side, or only correspond to the vertical size of the wide exit opening 656.

In various embodiments, the ratio of the flared input width $w_\triangleright$ to the parallel width $w_\|$ is large. For example, in some embodiments, the ratio of the flared input width $w_\triangleright$ to the parallel width $w_\|$ is greater than 3:1. In some embodiments, the ratio of the flared input width $w_\triangleright$ to the parallel width $w_\|$ is between 5:1 and 15:1. In a specific embodiment, the ratio of the flared input width $w_\triangleright$ to the parallel width $w_\|$ is about 10:1. For example, the flared input width $w_\triangleright$ may be about 15 mm while the parallel width $w_\|$ is about 1.5 mm resulting in a ratio of about 10:1.

Similarly, in various embodiments, ratio of the flared output width $w_\triangleright$ to the parallel width $w_\|$ is large. In some embodiments, the ratio of the flared output width $w_\triangleright$ to the parallel width $w_\|$ is greater than or equal to the ratio of the flared input width $w_\triangleright$ to the parallel width $w_\|$. For example, in some embodiments, the ratio of the flared output width $w_\triangleright$ to the parallel width $w_\|$ is greater than 3:1. In some embodiments, the ratio of the flared output width $w_\triangleright$ to the parallel width $w_\|$ is between 10:1 and 50:1. In a specific embodiment, the ratio of the flared output width $w_\triangleright$ to the parallel width $w_\|$ is about 38:1. For example, the flared output width $w_\triangleright$ may be about 57 mm while the parallel width $w_\|$ is about 1.5 mm resulting in a ratio of about 114:3 which is about 38:1.

The curved flared input sidewalls 633 and the parallel sidewalls 641 are joined together at a flared input-parallel angle $\theta_i$. The flared input-parallel angle $\theta_i$ is greater than 90° and less than 180°. In various embodiments, the flared input-parallel angle $\theta_i$ is between 135° and 170°. In one embodiment, the flared input-parallel angle $\theta_i$ is about 150°.

Similarly, the parallel sidewalls 641 and the flared output sidewalls 654 are joined together at a parallel-flared output angle $\theta_o$. The parallel-flared output angle $\theta_o$ is also greater than 90° and less than 180°. In various embodiments, the parallel-flared output angle $\theta_o$ is between 120° and 150°. In one embodiment, the parallel-flared output angle $\theta_o$ is about 135°. In other embodiments, the parallel-flared output angle $\theta_o$ is between 135° and 170°. In another embodiment, the parallel-flared output angle $\theta_o$ is about 150°.

Referring to FIG. 6B, the dielectric injector 622 includes a plasma double layer 643 and an anodic spot 45 during operation as part of a plasma processing apparatus to generate an ESP that includes both ESP electrons and ESP ions in a processing chamber. The anodic spot 45 has net positive charge at an inside surface and net negative charge at an outside surface. Since the ESP ions are positively charged, ESP ions are accelerated from the processing chamber into the dielectric injector 622 by the same electric potential gradient that accelerates source electrons from the source chamber into the dielectric injector 622. In other words an electron current flows from the source chamber through the dielectric injector 622 and into the processing chamber while an ion current of the same magnitude flows from the processing chamber through the dielectric injector 622 and into the source chamber.

The plasma double layer 643 includes a portion of the source electrons 646 and a portion of the ESP ions 647. The plasma double layer 643 forms in the flared input region 632. For example, the plasma double layer 643 may be near the curved flared input sidewalls 633. The tapering nature of the flared input region 632 may advantageously influence the shape of the plasma double layer 643 so that the anodic spot 45 is contained and includes the portion of the ESP ions 647.

The size of the anodic spot d may depend on the electron temperature and density and may be related to the Debye length $\lambda_D$. In various embodiments, the size of the anodic spot d is between $75\lambda_D$ and $125\lambda_D$. In one embodiment, the size of the anodic spot d is about $100\lambda_D$. As an example, for a plasma with an electron temperature of 5 eV and a density of $10^{10}$ cm$^{-3}$, the Debye length $\lambda_D$ may be about 160 µm and the size of the anodic spot d is about 16 mm. The flared input length $l_\triangleright$ is greater than the size of the anodic spot d which advantageously enables the flared input region 632 of the dielectric injector 622 to contain the anodic spot 45. Containment of the anodic spot 45 within the flared input region 632 of the dielectric injector 622 may beneficially enable a uniform electron current to be generated at each opening of the dielectric injector 622.

Figure 7:
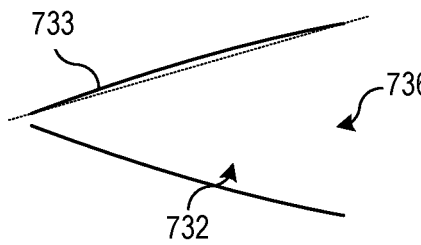
FIG. 7 illustrates a schematic diagram of an example flared region in accordance with an embodiment of the invention.
Figure 8:
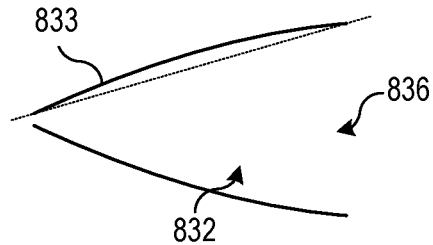
FIG. 8 illustrates a schematic diagram of another example flared region in accordance with an embodiment of the invention.
Figure 9:
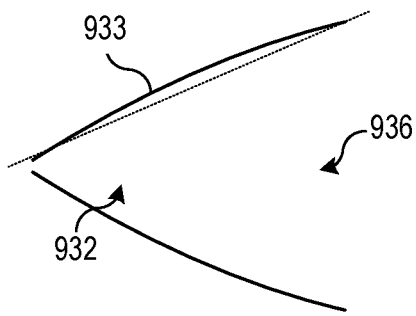
FIG. 9 illustrates a schematic diagram of still another example flared region in accordance with an embodiment of the invention.

FIGS. 7-9 illustrate several qualitative relationships between various parameters of flared regions usable in the embodiment dielectric injectors described herein. The specific values of the various parameters may depend on specific requirements of a given plasma process. Suitable values for a given practical implementation will be apparent to persons of skill in the art upon reference to the description.

FIG. 7 illustrates a schematic diagram of an example flared region in accordance with an embodiment of the invention. Referring to FIG. 7, a flared region 732 includes a wide entry opening 736 and curved flared sidewalls 733. The flared region 732 may be a specific implementation of embodiment flared input regions or embodiment flared output regions as described herein. The curved flared sidewalls 733 have a slight and gradual curvature as shown by the straight dotted line given for reference purposes only.

FIG. 8 illustrates a schematic diagram of another example flared region in accordance with an embodiment of the invention. Referring to FIG. 8, a flared region 832 includes a wide entry opening 836 and curved flared sidewalls 833. The flared region 832 may be a specific implementation of embodiment flared input regions or embodiment flared output regions as described herein. The curved flared sidewalls 833 have more pronounced but still gradual curvature in comparison to the slight curvature of the curved flared sidewalls 733 of FIG. 7 as shown by the straight dotted line given for reference purposes only. The wide entry opening 836 is identical to the wide entry opening 736 of FIG. 7 which decreases the angle between a parallel region and the flared region 832 due to the increased curvature. For example, the flared-parallel angle of the flared region 732 may be between 150° and 170° while the flared-parallel angle of the flared region 832 may be between 135° and 150°.

FIG. 9 illustrates a schematic diagram of still another example flared region in accordance with an embodiment of the invention. Referring to FIG. 9, a flared region 932 includes a wide entry opening 936 and curved flared sidewalls 933. The flared region 932 may be a specific implementation of embodiment flared input regions or embodiment flared output regions as described herein. The wide entry opening 936 is larger than the wide entry opening 836 of FIG. 8. For example, the ratio of the width of the wide entry opening 836 and the width of an attached parallel region may be between 5:1 and 10:1 while the ratio of the width of the wide entry opening 936 and the width of an attached parallel region may be between 10:1 and 15:1. Consequently, the reduction in cross sectional area is more abrupt despite the curved flared sidewalls 933 having a similar curvature as the curved flared sidewalls 833 of FIG. 8.

Figure 10:
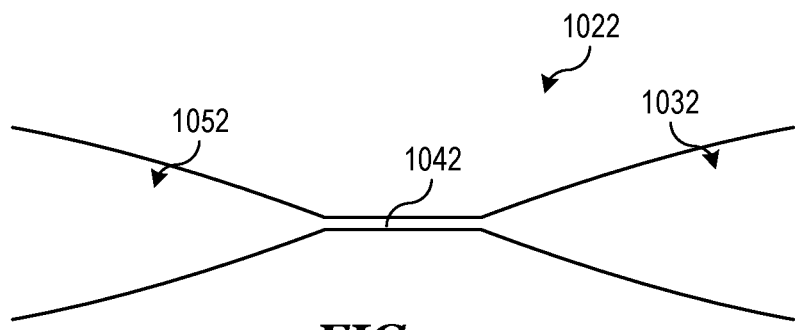
FIG. 10 illustrates a schematic diagram of another example dielectric injector including a flared input region, a parallel region, and a flared output region in accordance with an embodiment of the invention.

FIG. 10 illustrates a schematic diagram of another example dielectric injector including a flared input region, a parallel region, and a flared output region in accordance with an embodiment of the invention.

Referring to FIG. 10, a dielectric injector 1022 includes a flared input region 1032, a flared output region 1052, and a parallel region 1042 disposed between the flared input region 1032 and the flared output region 1052. The dielectric injector 1022 may be a specific implementation of other embodiment dielectric injectors such as the dielectric injector 322 of FIG. 3, for example.

The flared input region 1032 and the flared output region 1052 are substantially similar or identical in shape. Therefore, the dielectric injector 1022 is symmetric about a vertical axis through the center of the parallel region 1042. This configuration may be referred to as a symmetric dielectric injector. In other embodiments, the specific shape of the flared regions may be different while still maintaining the symmetry.

Figure 11:
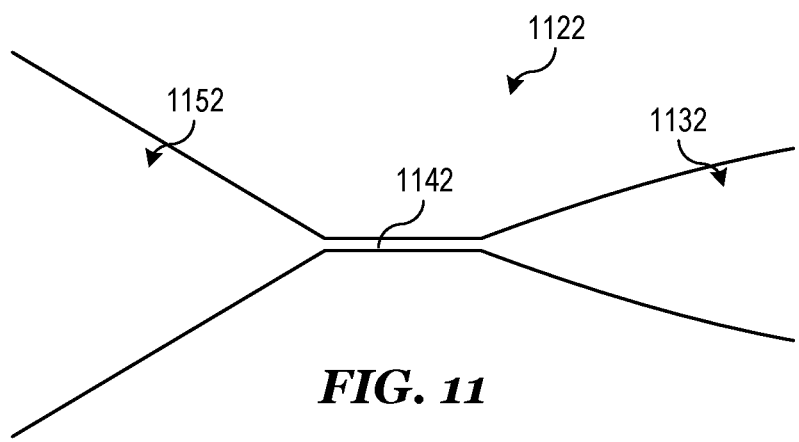
FIG. 11 illustrates a schematic diagram of still another example dielectric injector including a flared input region, a parallel region, and a flared output region in accordance with an embodiment of the invention.

FIG. 11 illustrates a schematic diagram of still another example dielectric injector including a flared input region, a parallel region, and a flared output region in accordance with an embodiment of the invention.

Referring to FIG. 11, a dielectric injector 1122 includes a flared input region 1132, a flared output region 1152, and a parallel region 1142 disposed between the flared input region 1132 and the flared output region 1152. The dielectric injector 1122 may be a specific implementation of other embodiment dielectric injectors such as the dielectric injector 322 of FIG. 3, for example.

In contrast to the dielectric injector 1022 of FIG. 10, the flared input region 1132 and the flared output region 1152 of the dielectric injector 1122 are different shapes. For example, the flared input region 1132 may be a parabolic cone while the flared output region 1152 is a cone (i.e. having zero curvature in a cross-section taken through a longitudinal axis of the dielectric injector 1022. A configuration in which one or more parameters of a flared input region differ from corresponding parameters of a flared output region may be referred to as an asymmetric dielectric injector. In other embodiments, the specific shape of each the flared regions may be different than the example illustrated while still maintaining the asymmetry.

Figure 12:
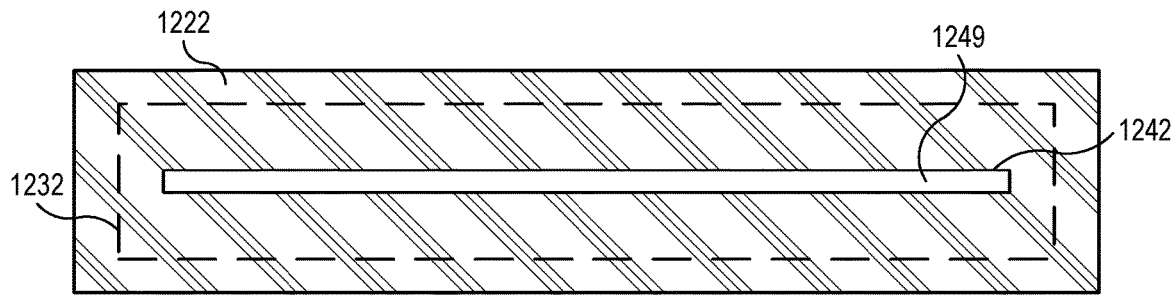
FIG. 12 illustrates a schematic diagram of an example dielectric injector including a slot opening in accordance with an embodiment of the invention.
Figure 13:
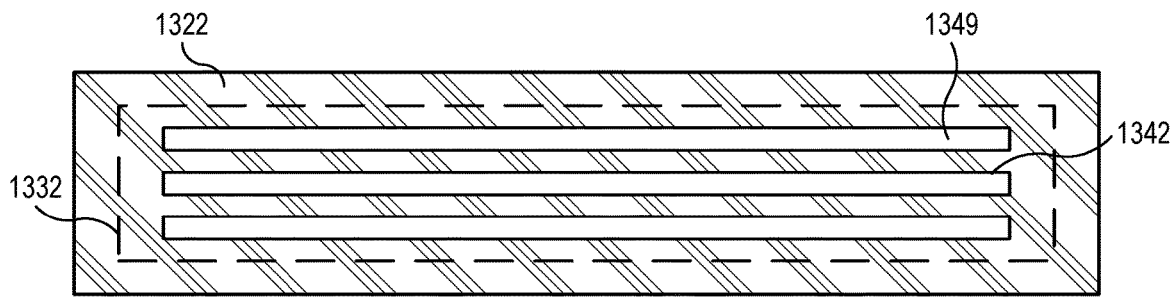
FIG. 13 illustrates a schematic diagram of an example dielectric injector including a plurality of slot openings in accordance with an embodiment of the invention.
Figure 14:
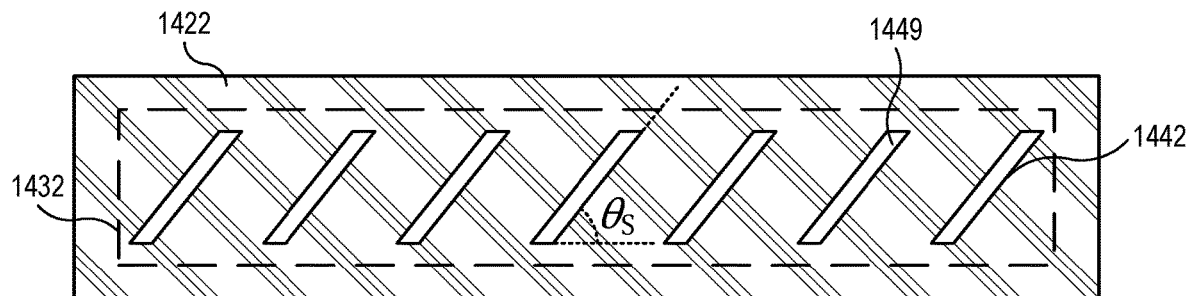
FIG. 14 illustrates a schematic diagram of an example dielectric injector including a plurality of angled slot openings in accordance with an embodiment of the invention.

FIGS. 12-14 illustrate several schematic diagrams of example dielectric injectors with one or more slot openings. FIG. 12 illustrates an example dielectric injector including a slot opening, FIG. 13 illustrates an example dielectric injector including a plurality of slot openings, and FIG. 14 illustrates an example dielectric injector including a plurality of angled slot openings in accordance with embodiments of the invention. The dielectric injectors of FIGS. 12-14 are shown from a perspective of being viewed from a processing chamber adjacent to the dielectric injector.

Referring to FIG. 12, a dielectric injector 1222 includes a flared input region 1232 and a parallel region 1242 which includes a single slot output opening 1249. The dielectric injector 1222 may be a specific implementation of other embodiment dielectric injectors such as the dielectric injector 522 of FIGS. 5A and 5B, for example.

Referring to FIG. 13, a dielectric injector 1322 includes a flared input region 1332 and a plurality of parallel regions 1242 which each include a slot output opening 1349. Therefore, the dielectric injector 1322 includes a plurality of slot openings in contrast to the single slot output opening 1249 of FIG. 12. The dielectric injector 1322 may be a specific implementation of other embodiment dielectric injectors such as the dielectric injector 522 of FIGS. 5A and 5B, for example.

Referring to FIG. 14, a dielectric injector 1422 includes a flared input region 1432 and a plurality of parallel regions 1442 which each include an angled slot output opening 1449. Each angled slot output opening 1449 makes a slot angle $\theta_S$ relative to horizontal sidewalls of the dielectric injector 1422. Each slot angle $\theta_S$ is between 0° and 90° and may be the same or different than other slot angles. The dielectric injector 1422 may be a specific implementation of other embodiment dielectric injectors such as the dielectric injector 522 of FIGS. 5A and 5B, for example.

The slot injectors described above in reference to FIGS. 12-14 are illustrated as having sharp corners when viewed from a processing chamber (or a source chamber). However, these and any other sharp corners of embodiment dielectric injectors may be rounded as previously described to further reduce or minimize local electric fields and collisions with surfaces of embodiment dielectric injectors.

Although many of the embodiment dielectric injectors described herein include one or more flared regions in addition to a parallel region, some plasma processing apparatuses may include dielectric injectors without flared regions. FIGS. 15A-17B illustrate several schematic diagrams of example dielectric injectors without flared regions. Applications for which such embodiment dielectric injectors are suitable will be apparent to persons of ordinary skill in the art upon reference to the description.

Figure 15A:
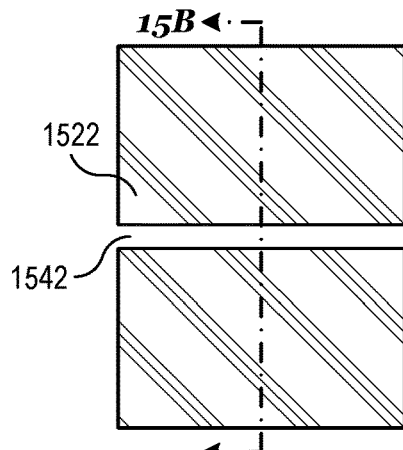
FIGS. 15A and 15B illustrate a schematic diagram of an example dielectric injector including a parallel region in accordance with an embodiment of the invention, where
Figure 15B:
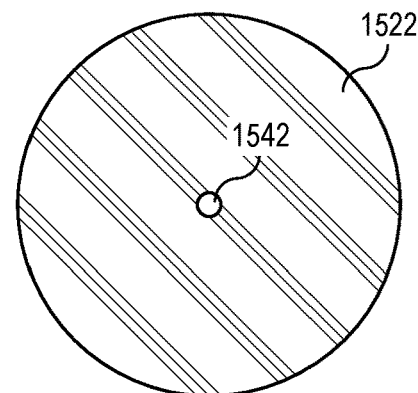

FIGS. 15A and 15B illustrate a schematic diagram of an example dielectric injector including a parallel region, where FIG. 15A illustrates a side view of the dielectric injector and FIG. 15B illustrates an end view of the dielectric injector in accordance with an embodiment of the invention. Referring to FIGS. 15A and 15B, a dielectric injector 1522 includes a single parallel region 1542. The dielectric injector 1522 may be a specific implementation of other embodiment dielectric injectors such as the dielectric injector 122 of FIG. 1, for example.

Figure 16A:
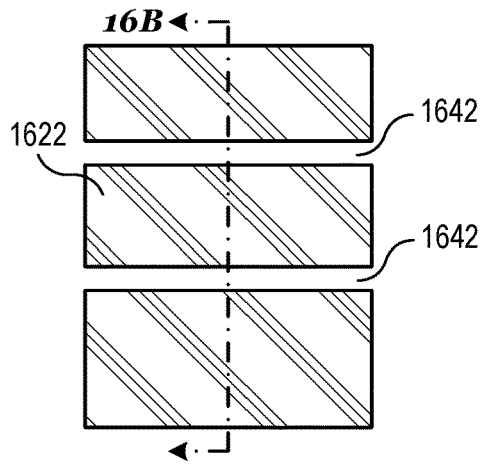
FIGS. 16A and 16B illustrate a schematic diagram of an example dielectric injector including three parallel regions in accordance with an embodiment of the invention, where
Figure 16B:
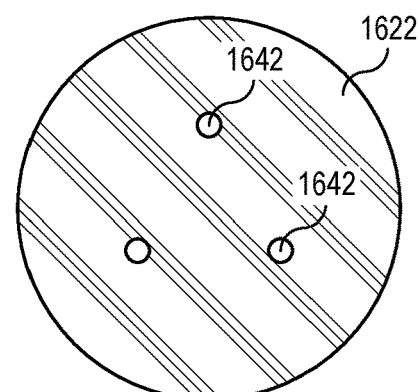

FIGS. 16A and 16B illustrate a schematic diagram of an example dielectric injector including three parallel regions, where FIG. 16A illustrates a side view of the dielectric injector and FIG. 16B illustrates an end view of the dielectric injector in accordance with an embodiment of the invention. Referring to FIGS. 16A and 16B, a dielectric injector 1622 includes three parallel regions 1642 arranged at vertices of an equilateral triangle. In other embodiments, other shapes may be used. The dielectric injector 1622 may be a specific implementation of other embodiment dielectric injectors such as the dielectric injector 122 of FIG. 1, for example.

Figure 17A:
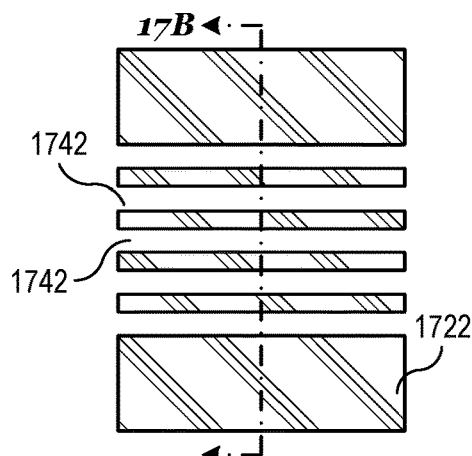
FIGS. 17A and 17B illustrate a schematic diagram of an example dielectric injector including a plurality of parallel regions in accordance with an embodiment of the invention, where
Figure 17B:
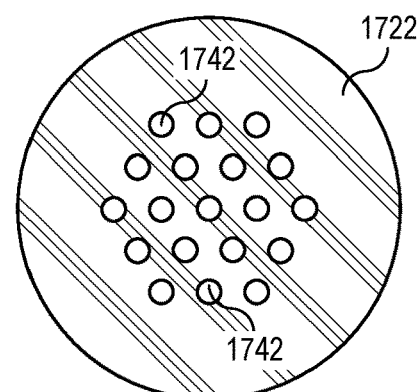

FIGS. 17A and 17B illustrate a schematic diagram of an example dielectric injector including a plurality of parallel regions, where FIG. 17A illustrates a side view of the dielectric injector and FIG. 17B illustrates an end view of the dielectric injector in accordance with an embodiment of the invention. Referring to FIGS. 17A and 17B, a dielectric injector 1722 includes a plurality of parallel regions 1742. The dielectric injector 1722 may be a specific implementation of other embodiment dielectric injectors such as the dielectric injector 122 of FIG. 1, for example.

Figure 18:
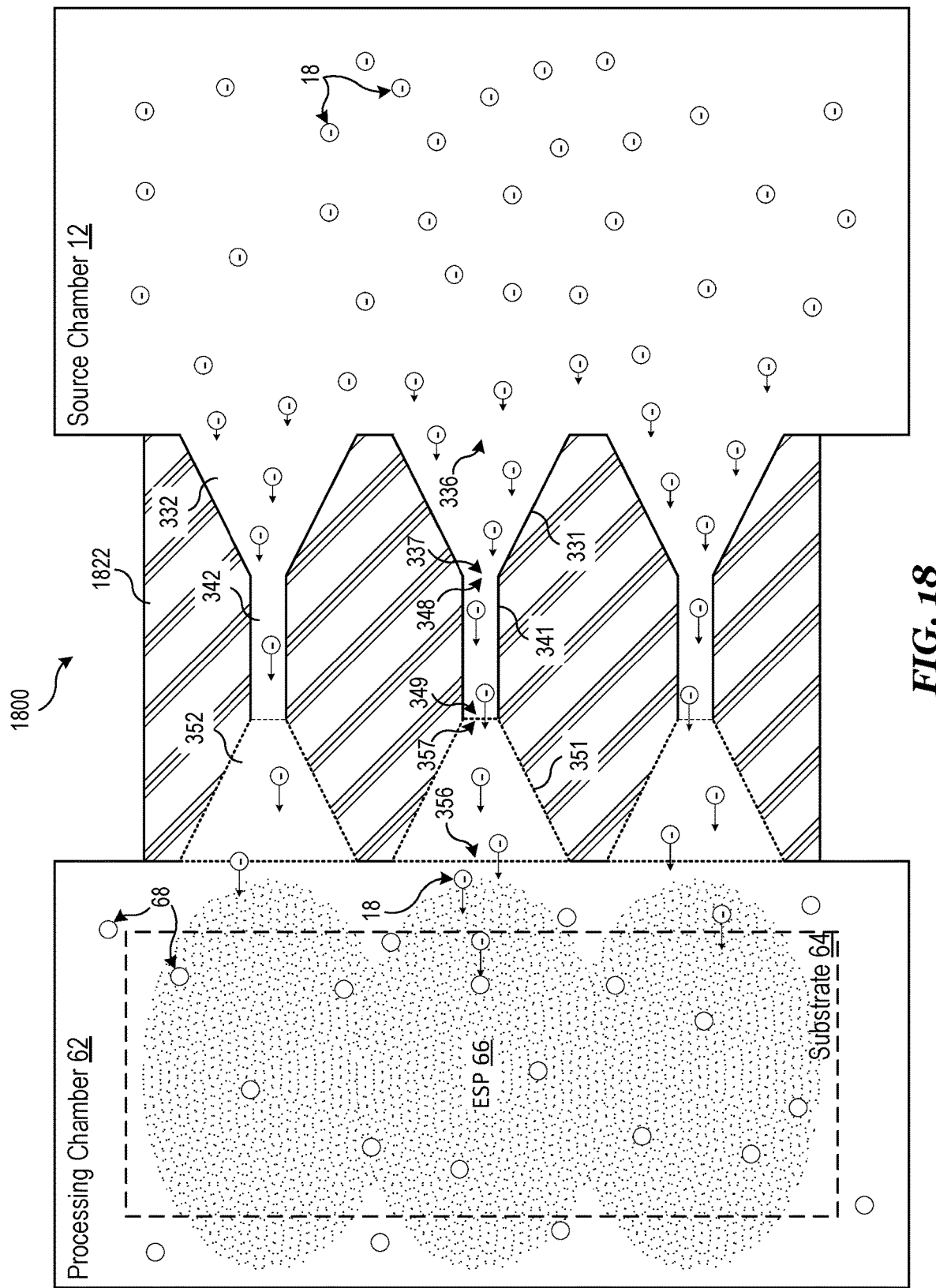
FIG. 18 illustrates a top view of a schematic diagram of an example plasma processing apparatus including a dielectric injector with a plurality of flared input regions and a plurality of parallel regions in accordance with an embodiment of the invention.

FIG. 18 illustrates a top view of a schematic diagram of an example plasma processing apparatus including a dielectric injector with a plurality of flared input regions and a plurality of parallel regions in accordance with an embodiment of the invention. Similarly labeled elements may be a previously described.

Referring to FIG. 18, a plasma processing apparatus 1800 includes a source chamber 12 containing source electrons 18 and a processing chamber 62 containing an ESP 66 generated using collisions of the source electrons 18 with particles 68 in the processing chamber 62. An optional substrate 64 to be processed by the ESP 66 may be included in the processing chamber 62. The plasma processing apparatus 1800 may be a specific implementation of other plasma processing apparatuses such as the plasma processing apparatus 100 of FIG. 1, for example.

A dielectric injector 1822 is disposed between the source chamber 12 and the processing chamber 62. The dielectric injector 1822 may be a specific implementation of other embodiment dielectric injectors such as the dielectric injector 122 of FIG. 1, for example. The dielectric injector 1822 includes a plurality of flared input regions 332, a plurality of parallel regions 342, and a plurality of optional flared output regions 352. Each of the flared input regions 332 include a wide entry opening 336 opening into the source chamber 12 and a narrow exit opening 337. Similarly, each of the optional flared output regions 352 include a narrow entry opening 357 and a wide exit opening 356 that may open into the processing chamber 62. Each of the parallel regions 342 include an input opening 348 adjacent to a respective narrow exit opening 337 and a respective output opening 349.

The plurality of flared input regions 332 and corresponding parallel regions 342 and optional flared output regions 352 are spatial separated within the dielectric injector 1822. This may advantageously improve uniformity of the ESP 66. For example multiple electron beams including the source electrons 18 from the source chamber 12 may be formed using the plurality of parallel regions 342 advantageously generating overlapping regions of plasma such that uniformity of the plasma is improved over a larger area.

Figure 19:
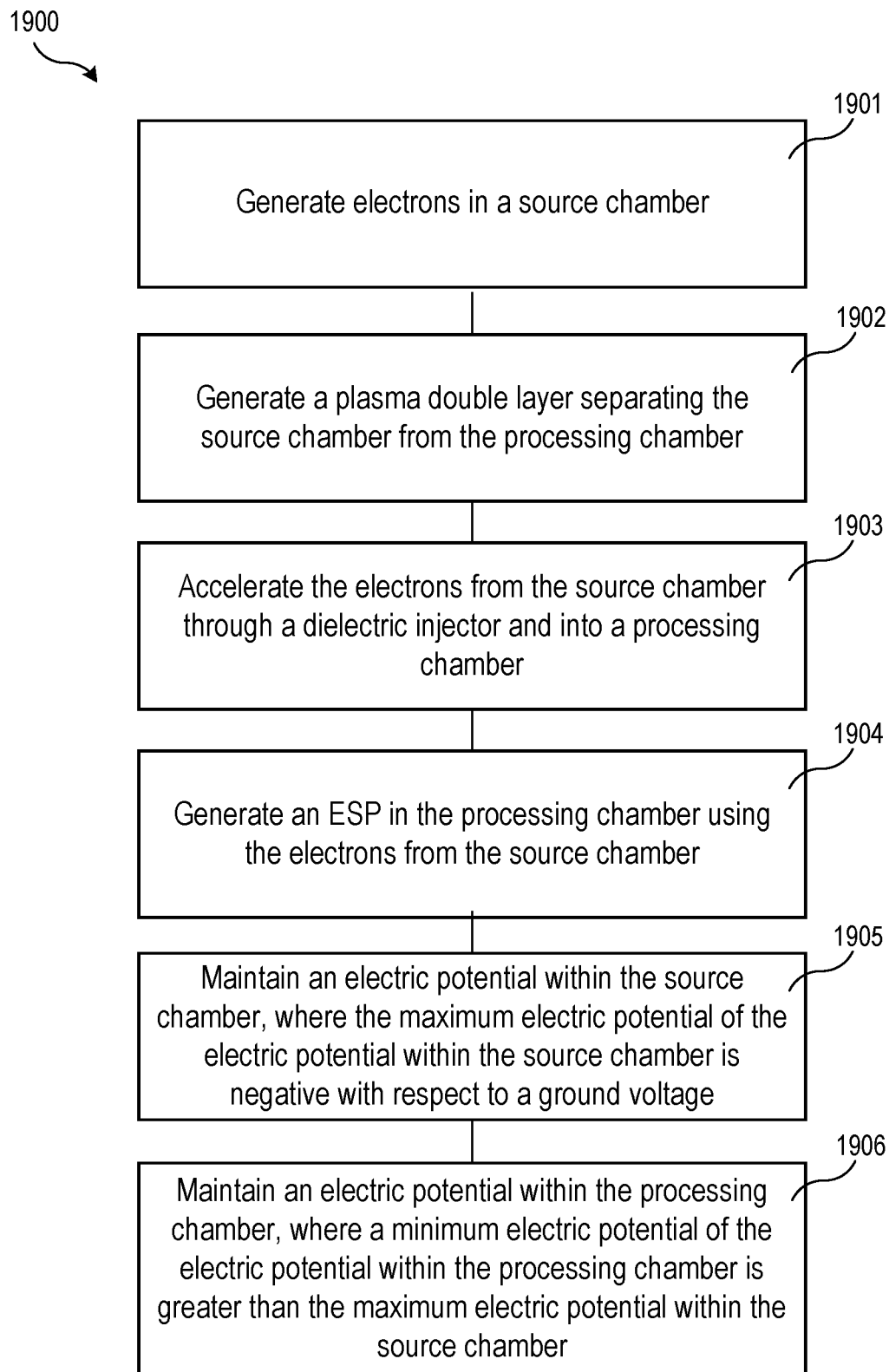
FIG. 19 illustrates an example method of operating a plasma processing apparatus including forming a plasma double layer separating a source chamber and a processing chamber in accordance with an embodiment of the invention.

FIG. 19 illustrates an example method of operating a plasma processing apparatus including forming a plasma double layer separating a source chamber and a processing chamber in accordance with an embodiment of the invention. The method of FIG. 19 may be performed by any of the plasma processing apparatuses as described herein, such as the plasma processing apparatus 100 of FIG. 1, for example.

Step 1901 of a method 1900 of plasma processing includes generating electrons in a source chamber. Step 1902 includes generating a plasma double layer separating the source chamber from the processing chamber. For example, the plasma double layer may result from electron and ion sheaths at surfaces of the dielectric injector. The plasma double layer may include a portion of the electrons from the source chamber and a portion of the ions of the generated ESP. The plasma double layer may advantageously decouple properties of species within the source chamber from properties of species with the processing chamber. For example, the plasma double layer may be a current carrying double layer. Step 1903 includes accelerating the electrons from the source chamber through a dielectric injector and into a processing chamber. Step 1904 includes generating an ESP in the processing chamber using the electrons from the source chamber. For example, the ESP may be generated using collisions of the electrons with particles in the processing chamber.

Step 1905 includes maintaining an electric potential within the source chamber. The maximum electric potential of the electric potential within the source chamber is negative with respect to a ground voltage. Step 1906 includes maintaining an electric potential within the processing chamber. The minimum electric potential of the electric potential within the processing chamber is greater than the maximum electric potential within the source chamber.

Figure 20:
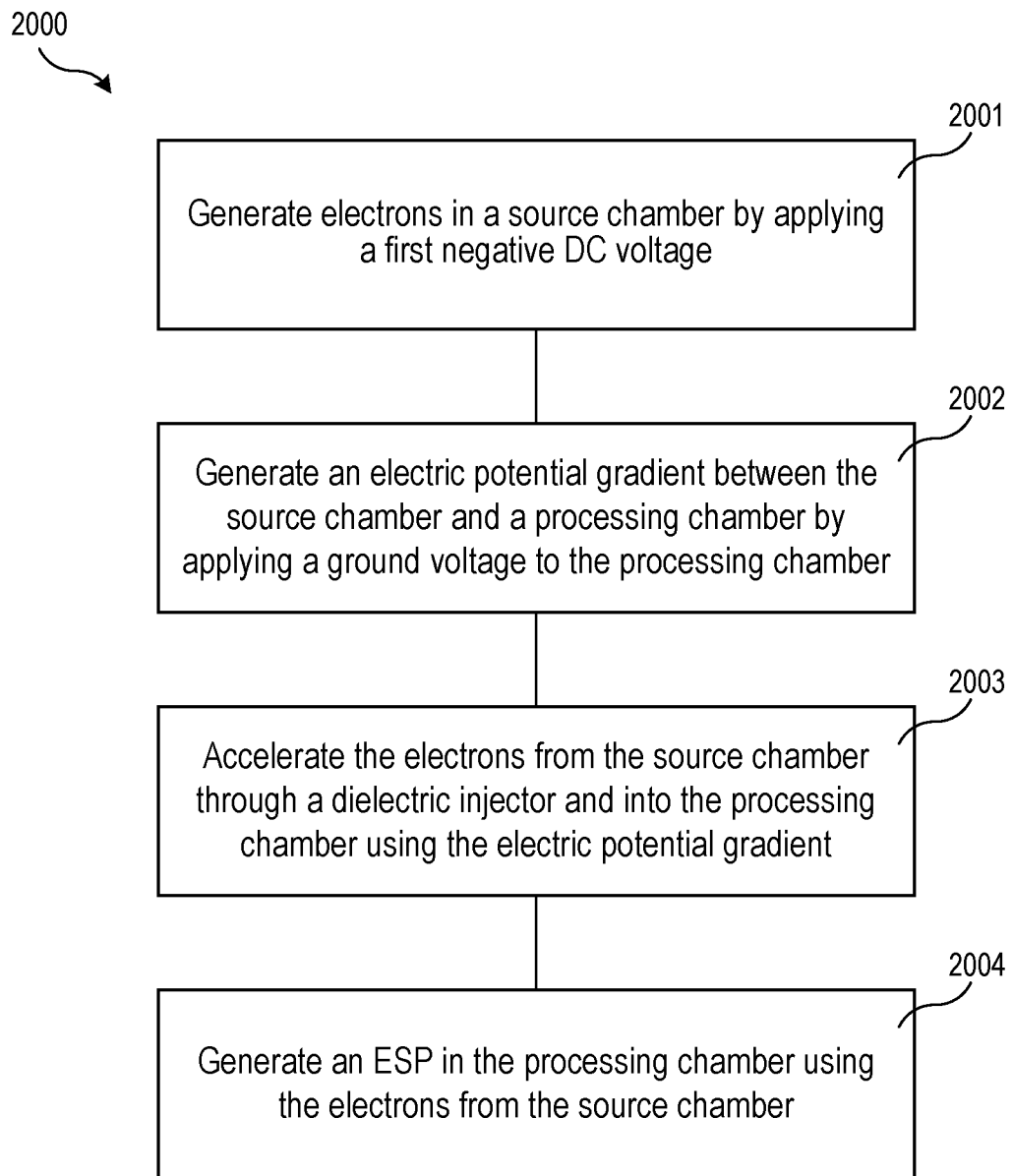
FIG. 20 illustrates an example method of operating a plasma processing apparatus including generating an electric potential gradient between a source chamber and a processing chamber by applying a ground voltage to the processing chamber in accordance with an embodiment of the invention.

FIG. 20 illustrates an example method of operating a plasma processing apparatus including generating an electric potential gradient between a source chamber and a processing chamber by applying a ground voltage to the processing chamber in accordance with an embodiment of the invention. The method of FIG. 20 may be performed by any of the plasma processing apparatuses as described herein, such as the plasma processing apparatus 200 of FIG. 2, for example.

Step 2001 of a method 2000 of plasma processing includes generating electrons in a source chamber. The electrons may be generated in source chamber by an ICP, a TCP, a microwave-induced plasma (MIP), etc. Step 2002 includes generating an electric potential gradient between the source chamber and a processing chamber by applying a first negative DC voltage to the source chamber and a ground voltage to the processing chamber. Step 2003 includes accelerating the electrons from the source chamber through a dielectric injector and into the processing chamber using the electric potential gradient. Step 2004 includes generating an ESP in the processing chamber using the electrons from the source chamber. For example, the ESP may be generated using collisions of the electrons with particles in the processing chamber.

Figure 21:
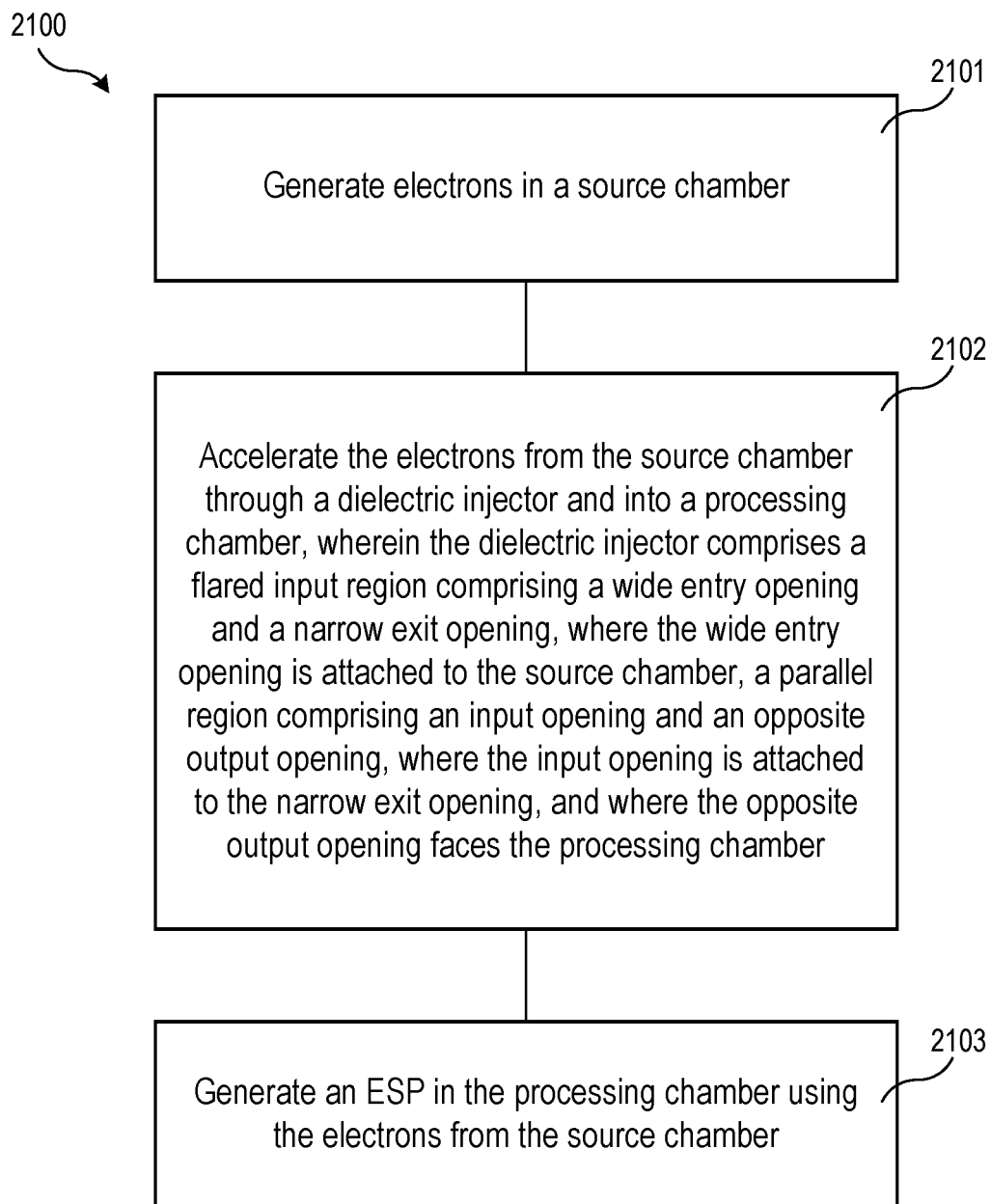
FIG. 21 illustrates an example method of operating a plasma processing apparatus including accelerating electrons from a source chamber through a dielectric injector and into a processing chamber where the dielectric injector includes a flared input region and a parallel region in accordance with an embodiment of the invention.

FIG. 21 illustrates an example method of operating a plasma processing apparatus including accelerating electrons from a source chamber through a dielectric injector and into a processing chamber where the dielectric injector includes a flared input region and a parallel region in accordance with an embodiment of the invention. The method of FIG. 21 may be performed by any of the plasma processing apparatuses as described herein, such as the plasma processing apparatus 300 of FIG. 3, for example.

Step 2101 of a method 2100 of plasma processing includes generating electrons in a source chamber. Step 2102 includes accelerating the electrons from the source chamber through a dielectric injector and into a processing chamber. The dielectric injector includes a flared input region comprising a wide entry opening and a narrow exit opening. The wide entry opening opens into the source chamber. The dielectric region further includes a parallel region including an input opening and an opposite output opening. The input opening is adjacent to the narrow exit opening. The opposite output opening faces the processing chamber. Step 2103 includes generating an ESP in the processing chamber using the electrons from the source chamber. For example, the ESP may be generated using collisions of the electrons with particles in the processing chamber.

It is noted that FIGS. 19-21 are not intended to limit the method steps to a particular order. Additionally, any of the steps as described in FIGS. 19-21 may be performed concurrently in any combination as well as separately. Accordingly, variation of the ordering and/or timing of the above method steps is within the scope of the methods as will be apparent to persons skilled in the art upon reference to the description.

Example embodiments of the invention are summarized here. Other embodiments can also be understood from the entirety of the specification as well as the claims filed herein.

Example 1. A method of plasma processing including: generating electrons in a source chamber; generating an electric potential gradient between the source chamber and a processing chamber by applying a first negative DC voltage to the source chamber and a ground voltage to the processing chamber; accelerating the electrons from the source chamber through a dielectric injector and into the processing chamber using the electric potential gradient; and generating an ESP in the processing chamber using the electrons from the source chamber.

Example 2. The method of example 1, where generating the electric potential gradient further includes allowing electrically conductive surfaces of the source chamber to float to produce a voltage gradient between the source chamber and the processing chamber using the first negative DC voltage and the ground voltage.

Example 3. The method of one of examples 1 and 2, further including: applying a second negative DC voltage at a substrate in the processing chamber; attracting ions of the ESP toward the substrate using the second negative DC voltage; and where applying the ground voltage to the processing chamber includes applying the ground voltage to sidewalls of the processing chamber.

Example 4. The method of one of examples 1 to 3, where: accelerating the electrons includes forming an electron beam in the processing chamber; and an electron density value measured along the electron beam is substantially uniform.

Example 5. The method of one of examples 1 to 4, where a first average electron temperature value of electrons of the ESP is less than a second average electron temperature value of the electrons in the source chamber.

Example 6. The method of one of examples 1 to 5, where a first average pressure value within the processing chamber is less than a second average pressure value within the source chamber.

Example 7. The method of one of examples 1 to 6, where generating the electrons in the source chamber includes generating a source plasma in the source chamber, the source plasma including the electrons in the source chamber.

Example 8. A method of plasma processing including: generating electrons in a source chamber; accelerating the electrons from the source chamber through a dielectric injector and into a processing chamber; generating an ESP in the processing chamber using the electrons from the source chamber; while generating the ESP, maintaining a first electric potential within the source chamber, where a maximum electric potential of the first electric potential is negative with respect to a ground voltage; and while generating the ESP, maintaining a second electric potential within the processing chamber, where a minimum electric potential of the second electric potential is greater than the maximum electric potential of the first electric potential.

Example 9. The method of example 8, further including: generating a plasma double layer in the dielectric injector, where the plasma double layer is a boundary that decouples values of charged particle parameters in the source chamber from values of charged particle parameters in the processing chamber.

Example 10. The method of one of examples 8 and 9, where a first average electron temperature of electrons of the ESP is less than a second average electron temperature of the electrons in the source chamber.

Example 11. The method of example 10, where the first average electron temperature is between 0.3 eV and 2.25 eV inclusively.

Example 12. The method of one of examples 8 to 11, where a first average pressure within the processing chamber is less than a second average pressure value within the source chamber.

Example 13. The method of example 12, where the first average pressure within the processing chamber is between 100 µTorr and 10 mTorr inclusively.

Example 14. The method of one of examples 8 to 13, where generating the electrons includes generating a source plasma in the source chamber, the source plasma including the electrons.

Example 15. An apparatus including: a DC voltage source including a positive terminal and a negative terminal, where the positive terminal is electrically coupled to a ground voltage; a source chamber electrically coupled to the negative terminal; a processing chamber electrically coupled to the positive terminal and the ground voltage; and a dielectric injector attached to the source chamber and the processing chamber and configured to deliver electrons from the source chamber to the processing chamber to generate an ESP in the processing chamber using the electrons from the source chamber.

Example 16. The apparatus of example 15, further including: a substrate disposed in the processing chamber, where the substrate is configured to be processed by the ESP in the processing chamber.

Example 17. The apparatus of one of examples 15 and 16, further including: an ICP source attached to the source chamber and configured to generate an ICP in the source chamber, the ICP including the electrons.

Example 18. The apparatus of one of examples 15 to 17, further including: an electron source attached to the source chamber and configured to generate the electrons in the source chamber, where the electron source is selected from a group consisting of a TCP source, a hollow cathode source, and a filament source.

Example 19. The apparatus of one of examples 15 to 18, where the dielectric injector includes a parallel region including an input opening attached to the source chamber, and an output opening attached to the processing chamber, where sidewalls of the parallel region are parallel.

Example 20. The apparatus of one of examples 15 to 19, where the dielectric injector includes three or more parallel regions, where each of the three or more parallel regions includes: sidewalls that are parallel; an input opening attached to the source chamber; and an output opening attached to the processing chamber.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, one or more of the embodiments of FIGS. 1-3, 4A-5B, and 18 may be combined in further embodiments. Similarly, embodiments described with respect to FIGS. 6A-17B may be combined with FIGS. 1-3, 4A-5B, and 18. It is therefore intended that the appended claims encompass any such modifications or embodiments.

What is claimed is:

1. A method of plasma processing comprising:
   generating electrons in a source chamber;
   generating an electric potential gradient within a dielectric injector coupled between the source chamber and a processing chamber by applying a first negative direct current (DC) voltage to an electrically conducting surface of the source chamber and a ground voltage to the processing chamber;
   accelerating the electrons from the source chamber through the dielectric injector and into the processing chamber using the electric potential gradient; and
   generating an electron-beam sustained plasma (ESP) in the processing chamber using the electrons from the source chamber.

2. The method of claim 1, wherein generating the electric potential gradient further comprises allowing one or more electrically conductive surfaces of the source chamber to float to produce a voltage gradient between the source chamber and the processing chamber using the first negative DC voltage and the ground voltage.

3. The method of claim 1, further comprising:
   applying a second negative DC voltage at a substrate in the processing chamber;
   attracting ions of the ESP toward the substrate using the second negative DC voltage; and
   wherein applying the ground voltage to the processing chamber comprises applying the ground voltage to sidewalls of the processing chamber.

4. The method of claim 1, wherein:
   accelerating the electrons comprises forming an electron beam in the processing chamber; and
   an electron density value measured along the electron beam is substantially uniform.

5. The method of claim 1, wherein a first average electron temperature value of electrons of the ESP is less than a second average electron temperature value of the electrons in the source chamber.

6. The method of claim 1, wherein a first average pressure value within the processing chamber is less than a second average pressure value within the source chamber.

7. The method of claim 1, wherein generating the electrons in the source chamber comprises generating a source plasma in the source chamber, the source plasma comprising the electrons in the source chamber.

8. A method of plasma processing comprising:
   generating electrons in a source chamber;
   accelerating the electrons from the source chamber through a dielectric injector and into a processing chamber;
   generating a plasma double layer in the dielectric injector;
   generating an electron-beam sustained plasma (ESP) in the processing chamber using the electrons from the source chamber;
   while generating the ESP, maintaining a first electric potential within the source chamber, wherein a maximum electric potential of the first electric potential is negative with respect to a ground voltage; and
   while generating the ESP, maintaining a second electric potential within the processing chamber, wherein a minimum electric potential of the second electric potential is greater than the maximum electric potential of the first electric potential.

9. The method of claim 8, wherein the plasma double layer is a boundary that decouples values of charged particle parameters in the source chamber from values of charged particle parameters in the processing chamber.

10. The method of claim 8, wherein a first average electron temperature of electrons of the ESP is less than a second average electron temperature of the electrons in the source chamber.

11. The method of claim 10, wherein the first average electron temperature is between 0.3 eV and 2.25 eV inclusively.

12. The method of claim 8, wherein a first average pressure within the processing chamber is less than a second average pressure value within the source chamber.

13. The method of claim 12, wherein the first average pressure within the processing chamber is between 100 µTorr and 10 mTorr inclusively.

14. The method of claim 8, wherein generating the electrons comprises generating a source plasma in the source chamber, the source plasma comprising the electrons.

15. A method of plasma processing comprising:
   generating electrons in a source chamber;
   generating an electric potential gradient between the source chamber and a processing chamber by applying a first negative direct current (DC) voltage to the source chamber and a ground voltage to the processing chamber;
   accelerating the electrons from the source chamber through a dielectric injector and into the processing chamber using the electric potential gradient;
   generating an electron-beam sustained plasma (ESP) in the processing chamber using the electrons from the source chamber;
   applying a second negative DC voltage at a substrate in the processing chamber;
   attracting ions of the ESP toward the substrate using the second negative DC voltage; and
   wherein applying the ground voltage to the processing chamber comprises applying the ground voltage to sidewalls of the processing chamber.

16. The method of claim 15, further comprising:
   generating a plasma double layer in the dielectric injector, wherein the plasma double layer is a boundary that decouples values of charged particle parameters in the source chamber from values of charged particle parameters in the processing chamber.

17. The method of claim 15, wherein:
   accelerating the electrons comprises forming an electron beam in the processing chamber; and
   an electron density value measured along the electron beam is substantially uniform.

18. The method of claim 15, wherein a first average electron temperature value of electrons of the ESP is less than a second average electron temperature value of the electrons in the source chamber.

19. A method of plasma processing comprising:
generating electrons in a source chamber;
generating an electric potential gradient between the source chamber and a processing chamber by applying a first negative direct current (DC) voltage to the source chamber and a ground voltage to the processing chamber;
accelerating the electrons from the source chamber through a dielectric injector and into the processing chamber using the electric potential gradient;
generating an electron-beam sustained plasma (ESP) in the processing chamber using the electrons from the source chamber; and
generating a plasma double layer in the dielectric injector, wherein the plasma double layer is a boundary that decouples values of charged particle parameters in the source chamber from values of charged particle parameters in the processing chamber.

20. The method of claim 19, wherein:
accelerating the electrons comprises forming an electron beam in the processing chamber; and
an electron density value measured along the electron beam is substantially uniform.

21. The method of claim 19, wherein a first average electron temperature value of electrons of the ESP is less than a second average electron temperature value of the electrons in the source chamber.

\* \* \* \* \*